United States Patent
Wu

(10) Patent No.: US 6,734,484 B2
(45) Date of Patent: May 11, 2004

(54) VERTICAL TRANSISTOR DRAM STRUCTURE AND ITS MANUFACTURING METHODS

(75) Inventor: Ching-Yuan Wu, Hsinchu (TW)

(73) Assignee: Intellignet Sources Development Corp., Hsinchu (TW)

( * ) Notice: Subject to any disclaimer, the term of this patent is extended or adjusted under 35 U.S.C. 154(b) by 98 days.

(21) Appl. No.: 10/227,438

(22) Filed: Aug. 26, 2002

(65) Prior Publication Data

US 2004/0036101 A1 Feb. 26, 2004

(51) Int. Cl.⁷ .............................. H01L 31/116
(52) U.S. Cl. .................. 257/301; 257/302; 257/304; 257/305; 438/242; 438/243
(58) Field of Search .................. 257/301, 302, 257/304, 305, 399; 438/242, 243, 246

(56) References Cited

U.S. PATENT DOCUMENTS

| | | | | |
|---|---|---|---|---|
| 5,998,821 A | * | 12/1999 | Hieda et al. | 257/301 |
| 6,265,742 B1 | * | 7/2001 | Gruening et al. | 257/304 |
| 6,391,705 B1 | * | 5/2002 | Hsiao et al. | 438/243 |
| 6,552,382 B1 | * | 4/2003 | Wu | 257/305 |
| 6,576,945 B2 | * | 6/2003 | Mandelman et al. | 257/301 |

* cited by examiner

Primary Examiner—Hoai Ho
Assistant Examiner—Dao H. Nguyen
(74) Attorney, Agent, or Firm—Pro-Techtor International Services

(57) ABSTRACT

A vertical transistor DRAM structure is disclosed by the present invention, in which a trench structure comprises a deep-trench region having a vertical transistor and a second-type shallow-trench-isolation region being formed in a side portion of the deep-trench region and a common-drain structure comprises different implant regions being formed under a common-drain diffusion region in another side portion of the deep-trench region. The vertical transistor DRAM structure is, used to implement two contactless DRAM arrays. A first-type contactless DRAM array comprises a plurality of metal bit-lines integrated. with planarized common-drain conductive islands and a plurality of highly conductive word-lines. A second-type contactless DRAM array comprises a plurality of metal word-lines integrated with planarized common-gate conductive islands and a plurality of common-drain conductive bit-lines.

20 Claims, 22 Drawing Sheets

VERTICAL TRANSISTOR DRAM STRUCTURE AND ITS MANUFACTURING METHODS

BACKGROUND OF THE INVENTION

1. Field of the Invention

The present invention relates generally to a trench-type DRAM memory cell and its manufacturing method and, more particularly, to a vertical transistor DRAM structure and its manufacturing methods.

2. Description of Related Art

A dynamic random-access-memory (DRAM) cell including an access transistor -and a storage capacitor has become the most important storage element in electronic system, especially in computer and communication system. The DRAM density is increased very rapidly in order to decrease the cost per bit and, therefore, an advanced photolithography is needed to decrease the minimum-feature-size (F) of a cell.

The output voltage of a DRAM cell is proportional to the capacitance value of the storage capacitor of the DRAM cell and, therefore, the storage capacitor must have a satisfactory capacitance value to have stable operation of the cell as the applied voltage is scaled. Basically, the storage capacitor can be implemented in a trench-type or a stack-type. The trench-type is formed by forming a deep trench in a semiconductor substrate without increasing the surface area of the semiconductor-substrate surface. The stack-type is formed by implementing a capacitor structure over the access transistor and its nearby dummy-transistor structure through the conductive contact-plug over the node diffusion region of the access transistor. Basically, the cell size of the stack-type DRAM is limited by a dummy transistor being formed over the isolation region. Accordingly, the limit cell size of the stack-type DRAM is $8F^2$ for shallow-trench-isolation. However, the cell size of a trench-type lateral transistor DRAM is limited by the space between nearby deep-trench capacitors and the separation between the lateral access transistor and the deep-trench capacitor. Therefore, the limit cell size of a trench-type lateral transistor DRAM is also $8F^2$ if the separation between the lateral access transistor and the trench capacitor can't be minimized.

A typical example of a trench-type lateral transistor DRAM cell is shown in FIG. 1, in which a deep trench is formed in a semiconductor substrate 100. A trench capacitor is formed in a lower portion of the deep trench, in which a lower capacitor node 101 is formed by a heavily-doped n+ diffusion region using an arsenic-silicate-glass (ASG) film as a dopant diffusion source; an upper capacitor node 103a is made of doped polycrystalline-silicon; and a capacitor-dielectric layer 102 is formed by a composite dielectric layer such as an oxide-nitride-oxide structure or a nitride-oxide structure. An oxide collar 104 is used to separate the lower capacitor node 101 from a source diffusion region 105a, 105b, and a capacitor-node connector 103b being made of doped polycrystalline-silicon is used to electrically connect the upper capacitor node 103a to a source conductive node 103c. The source conductive node 103c is made of heavily-doped polycrystalline-silicon to act as a dopant diffusion source for forming an n+source diffusion region 105a. A shallow-trench-isolation (STI) region 106 is filled with a CVD-oxide layer in order to separate nearby trench capacitors. Two gate-stacks 108, 109 are formed over an upper surface, in which one gate-stack 108 is acted as a passing word line and another gate-stack 109 being acted as an excess transistor. A common-source diffusion region 105b and a common-drain diffusion region 107 for a bit-line node are formed in an upper surface of the semiconductor substrate 100. From FIG. 1, it is clearly seen that the limit cell size is $8F^2$ if the space between two nearby trench capacitors is defined to be a minimum-feature-size (F) of technology used. It is clearly seen that the cell size can be further reduced if the separation between two adjacent deep trenches and the common-source region can be reduced.

Apparently, the common-source diffusion region 105b, 105a and the gate-stack 109 shown in FIG. 1 can be removed and are formed in the deep-trench region to become a vertical transistor DRAM structure, then the semiconductor surface area can be saved at least $2F^2$. However, a depth of the deep trenches becomes deeper, resulting in a further problem for forming a deeper trench. Moreover, the threshold-voltage and the punch-through voltage of the vertical transistor are difficult to be controlled, and a longer channel length is therefore used by the prior art. As a consequence, a deeper trench depth is required, and a slower read/write speed of a memory cell due to a longer channel length becomes another serious problem for the prior art.

It is, therefore, a major objective of the present invention to offer a vertical transistor DRAM structure for obtaining a cell size of $4F^2$.

It is another objective of the present invention to easily offer different implant regions for forming punch-through stops and adjusting threshold-voltages of the vertical transistor and the parasitic collar-oxide transistor in a self-aligned manner so a deeper trench is not required.

It is a further objective of the present invention to offer a manufacturing method for forming the vertical transistor DRAM structure with less masking photoresist steps.

It is yet another objective of the present invention to offer two different contactless vertical transistor DRAM array structures for high-speed read and write operations.

SUMMARY OF THE INVENTION

A vertical transistor DRAM structure and its contactless vertical transistor DRAM arrays are disclosed by the present invention. The vertical transistor DRAM structure comprises a trench structure and a common-drain structure, in which the trench structure includes a deep-trench region having a vertical transistor and a second-type shallow-trench-isolation region being formed in a side portion of the deep-trench region and the common-drain structure includes a common-drain diffusion region and different implant regions under the common-drain diffusion region for forming punch-through stops of the vertical transistor and the parasitic collar-oxide transistor. The deep-trench region comprises a lower capacitor node made of an n+ diffusion region being formed in a lower portion of a deep trench, a capacitor-dielectric layer being formed over the lower capacitor node, an upper capacitor node being formed over the capacitor-dielectric layer, a collar-oxide layer together with a capacitor-node connector being formed over the capacitor-dielectric layer and the upper capacitor node, a source conductive node being formed over the collar-oxide layer and the capacitor-node connector to act as a dopant diffusion source for forming a common-source diffusion region, an isolation silicon-dioxide node being formed over the source conductive node, and a conductive-gate node of a vertical transistor being formed on the isolation silicon-dioxide node. The second-type shallow-trench-isolation region being formed in a side portion of the deep-trench region comprises a second-type second or third raised field-oxide layer with a bottom surface level approximately equal to that of the collar-oxide layer and an n+ diffusion region being formed under the second-type second or third raised field-oxide layer. The vertical transistor comprises a capping conductive-gate layer being integrated with the conductive-gate node, a gate-dielectric layer being formed over a sidewall of the deep trench, a common-drain diffusion region of a second conductivity type being formed over an upper portion of the semiconductor substrate, and the common-source diffusion region of the second conductivity type being formed near the source conductive node for forming a first-type vertical transistor DRAM cell; and comprises the conductive-gate node being formed in an upper portion of the deep trench, a planarized common-gate conductive island integrated with a metal word-line being connected with a portion of the conductive-gate node, a gate-dielectric layer being formed over a sidewall of the deep trench, a common-drain diffusion region of a second conductivity type being formed over an upper portion of the semiconductor substrate, and a common-source diffusion region of the second conductivity type being formed near the source conductive node for forming a second-type vertical transistor DRAM cell. The common-drain region comprises the common-drain diffusion region having a shallow heavily-doped diffusion region formed within a lightly-doped diffusion region, different implant regions under the common-drain diffusion regions for forming punch-through stops and adjusting threshold voltages of the vertical transistor and the parasitic collar-oxide transistor, and a planarized common-drain conductive island integrated with a metal bit-line being formed on the common-drain diffusion region outside of a third sidewall dielectric spacer formed over a sidewall of the deep-trench region for forming the first-type vertical transistor DRAM cell; and comprises a common-drain diffusion region having a shallow heavily-doped diffusion region formed within a lightly-doped diffusion region, different implant regions under the common-drain diffusion regions for forming punch-through stops and adjusting threshold voltages of the vertical transistor and the parasitic collar-oxide transistor, and a common-drain conductive bit-line being formed at least over the common-drain diffusion region outside of a third sidewall dielectric spacer being formed over a sidewall of the deep-trench region for forming the second-type vertical transistor DRAM cell. The cell size of the vertical transistor DRAM structure can be fabricated to be equal to $4F^2$.

The vertical transistor DRAM structure of the present invention is used to implement two contactless vertical transistor DRAM arrays. A first-type contactless vertical transistor DRAM array comprises a plurality of first-type vertical transistor DRAM cells, a plurality of metal bit-lines integrated with planarized common-drain conductive islands being patterned to be aligned above a plurality of active regions, and a plurality of capping conductive-gate layers integrated with the conductive-gate nodes to act as a plurality of conductive word-lines being formed transversely to the plurality of metal bit-lines. A second-type contactless vertical transistor DRAM array comprises a plurality of second-type vertical transistor DRAM cells, a plurality of metal word-lines integrated with planarized common-gate conductive islands being patterned to be aligned above a plurality of active regions, and a plurality of highly conductive common-drain bus-lines acted as a plurality of conductive bit-lines being formed transversely to the plurality of metal word-lines.

DETAILED DESCRIPTION OF THE PREFERRED EMBODIMENTS

Figure 1:
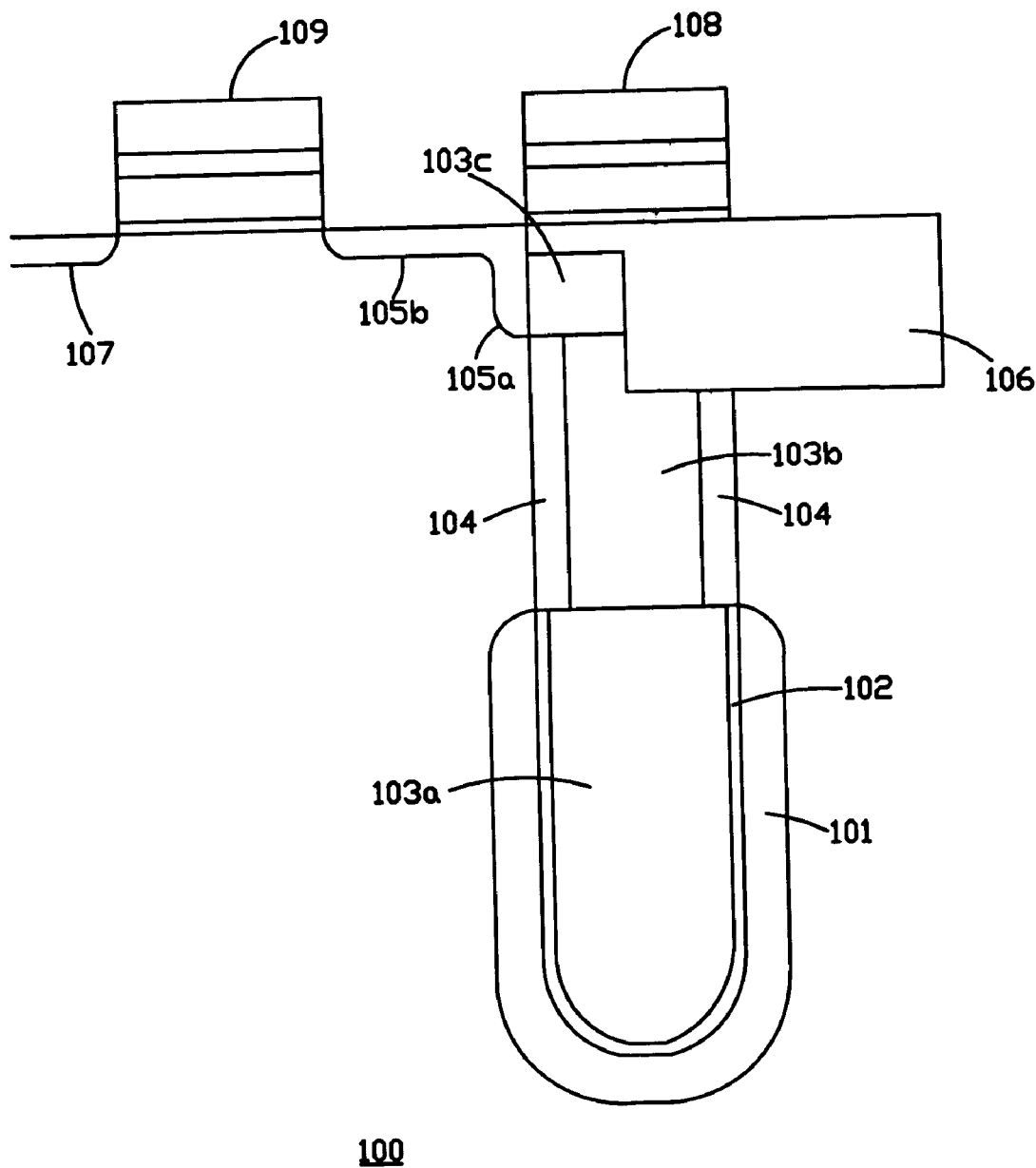
FIG. 1 shows a typical schematic diagram of a trench-type lateral transistor DRAM cell of the prior art.
Figure 2A:
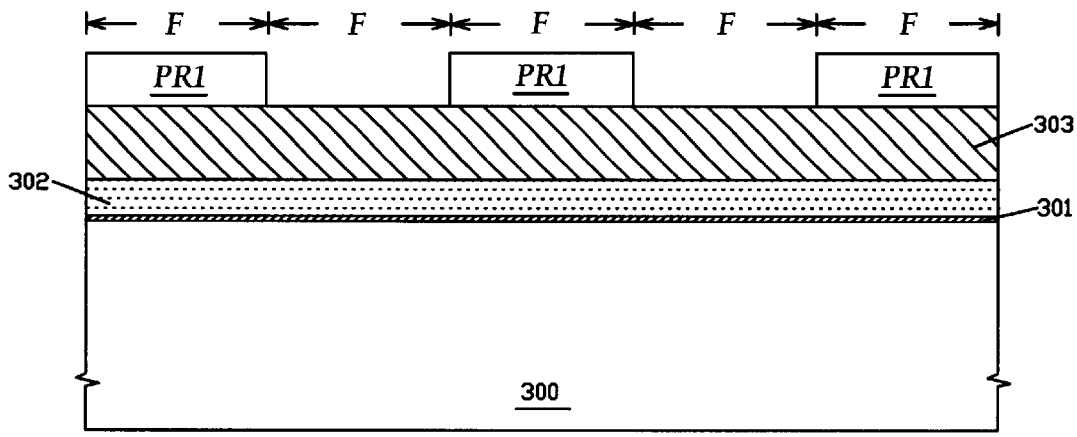
FIG. 2A through FIG. 2C show the process steps and their cross-sectional views of fabricating a first-type shallow-trench-isolation structure for forming a vertical transistor DRAM structure of the present invention.
Figure 2B:
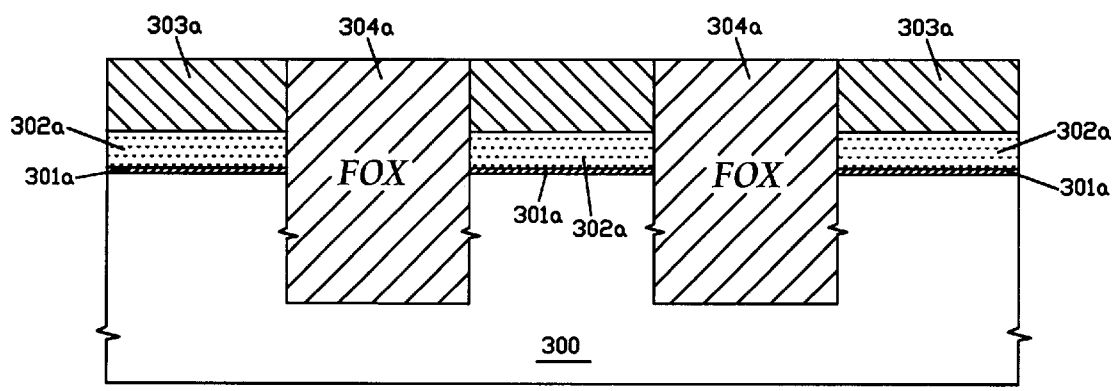
Figure 2C:
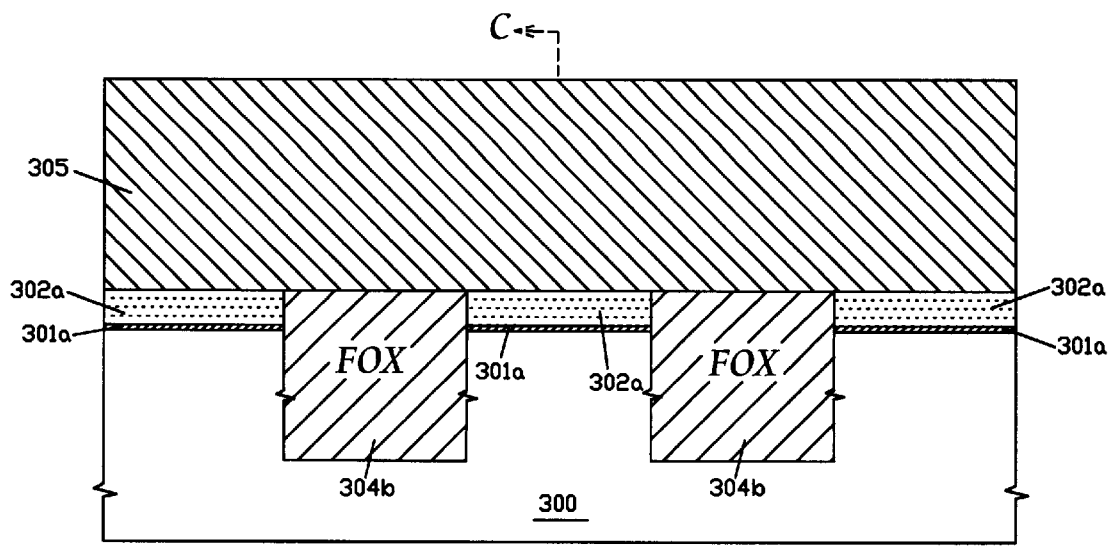

Referring now to FIG. 2A through FIG. 2C, there are shown the process steps and their cross-sectional views of fabricating a first-type shallow-trench-isolation (STI) structure for forming a vertical transistor DRAM structure of the present invention. FIG. 2A shows that a first dielectric layer 301 is formed on a semiconductor substrate 300 of a first conductivity type, a first conductive layer 302 is formed on the first dielectric layer 301, a first masking dielectric layer 303 is formed over the first conductive layer 302, and a plurality of masking photoresist PR1 are formed over the first masking dielectric layer 303 to define a plurality of active regions (under PR1) and a plurality of first-type shallow-trench-isolation (STI) regions (outside of PR1). The first dielectric layer 301 is preferably a thermal-oxide layer or a nitrided thermal-oxide layer and its thickness is preferably between 50 Angstroms and 200 Angstroms. The first conductive layer 302 is preferably a doped polycrystalline-silicon or doped amorphous-silicon layer as deposited by low-pressure chemical-vapor-deposition (LPCVD) and its thickness is preferably between 200 Angstroms and 3000 Angstroms. The first masking dielectric layer 303 is preferably made of silicon-nitride as deposited by LPCVD and its thickness is preferably between 1000 Angstroms and 3000 Angstroms. It should be noted that a first anti-reflection coating (ARC) layer (not shown) can be formed over the first masking dielectric layer 303 to act as a hard masking layer for patterning the first masking dielectric layer 303.

FIG. 2B shows that the first masking dielectric layer 303, the first conductive layer 302, and the first dielectric layer 301 outside of the plurality of masking photoresist PR1 are sequentially removed by using anisotropic dry etching; the semiconductor substrate 300 is then anisotropically etched to form first-type shallow trenches, and the plurality of masking photoresist PR1 are then stripped; and subsequently, the first-type shallow trenches are refilled with first-type planarized field-oxide layers 304a. The depth of the first-type shallow trenches in the semiconductor substrate 300 is between 4000 Angstroms and 15000 Angstroms. The first-type planarized field-oxide layer 304a is preferably made of-silicon-oxide, phosphosilicate glass (p-glass), boro-phosphosilicate glass (BP-glass) as deposited by high-density plasma (HDP) CVD or, plasma-enhanced (PE) CVD, and is formed by first depositing a thick-oxide film 304 to fill up each gap formed by the first-type shallow trenches and then planarizing the deposited thick-oxide film 304 using chemical-mechanical polishing (CMP) with the first masking dielectric layer 303a as a polishing stop.

FIG. 2C shows that the first-type planarized field-oxide layers 304a are etched back to a depth equal to a thickness of the first masking dielectric layer 303a to form first-type first raised field-oxide layers 304b and then the first masking dielectric layers 303a are removed by using hot-phosphoric acid or anisotropic dry etching; and subsequently, a second masking dielectric layer 305 is formed over a flat surface being alternately formed by the first conductive layer 302a and the first-type first raised field-oxide layer 304b. The second masking dielectric layer 305 is preferably made of silicon-nitride as deposited by LPCVD and its thickness is preferably between 3000 Angstroms and 10000 Angstroms. The cross-sectional view along an active region as indicated by a C—C' line is shown in FIG. 3A.

Figure 3A:
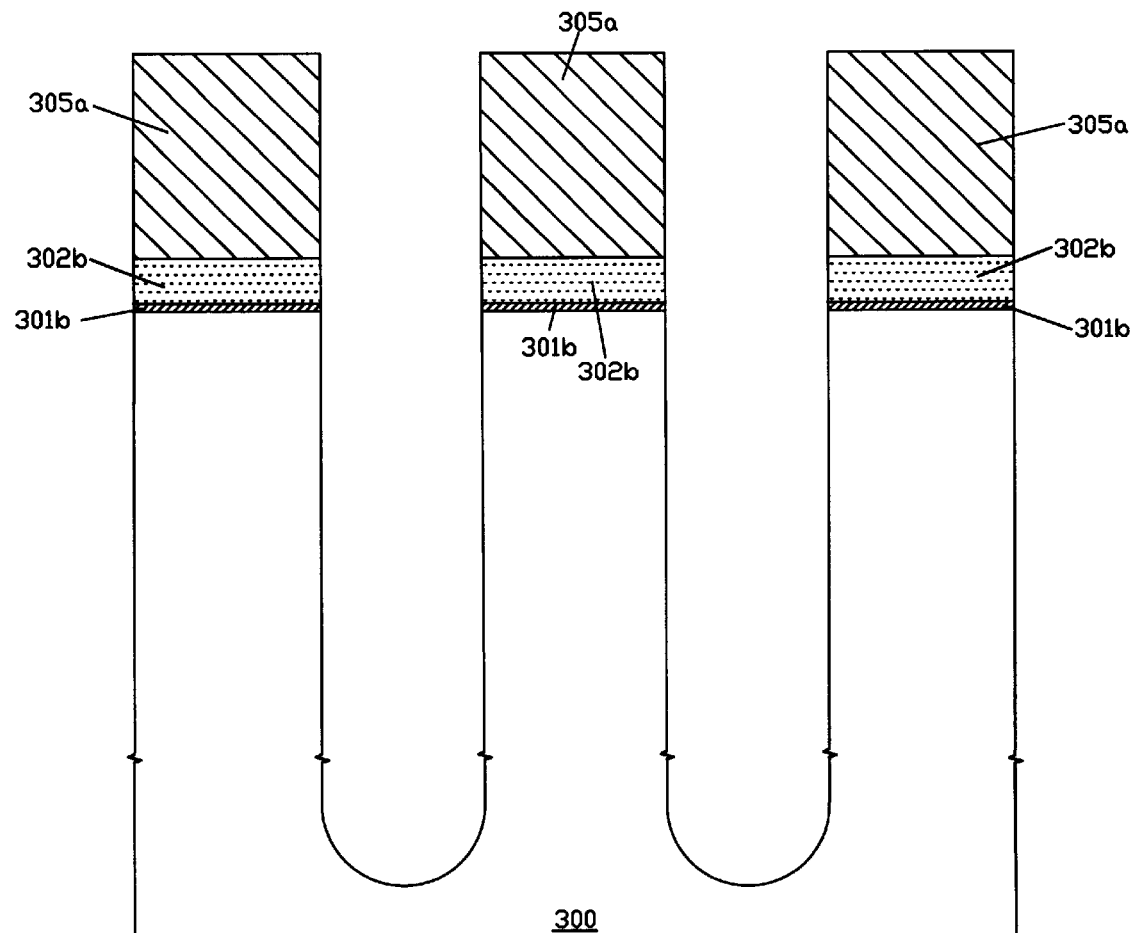
FIG. 3A through FIG. 3F show the process steps and their cross-sectional views of fabricating a vertical transistor DRAM structure of the present invention.

Referring now to FIG. 3A through FIG. 3F, there are shown the process steps and their cross-sectional views of fabricating a vertical transistor DRAM structure of the present invention. FIG. 3A shows that a plurality of deep trenches are formed in the semiconductor substrate 300, which includes a masking photoresist step for patterning the second masking dielectric layer 305, an anisotropic dry etching process to sequentially remove the first conductive layer 302a and the first dielectric layer 301a, and a deep-trench etching process. It should be noted that the first-type first raised field-oxide layers 304b in each of the plurality of first-type STI regions are also slightly etched during the removal of the first dielectric layers 301a to form first-type second raised field-oxide layers 304c between the second masking dielectric layers 305a.

Figure 3B:
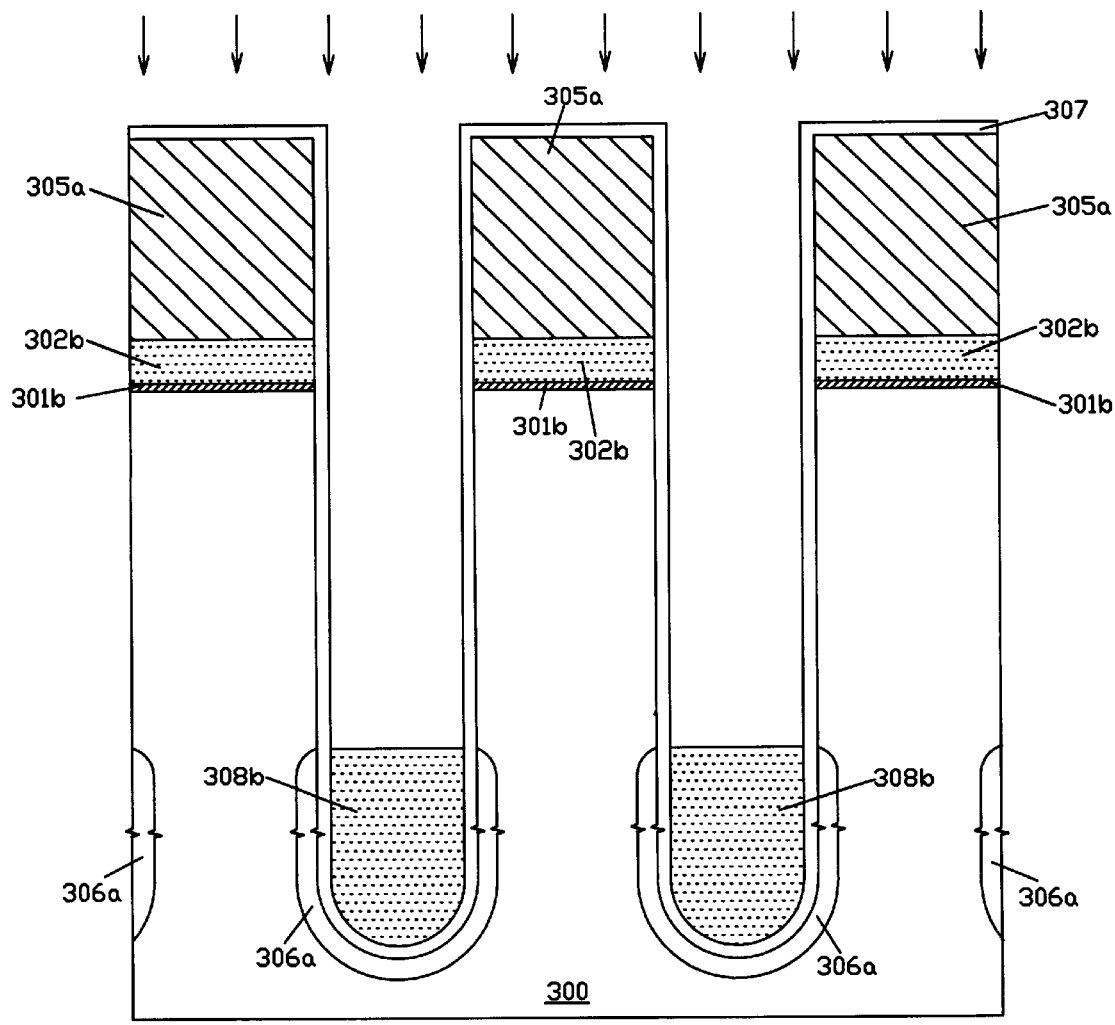

FIG. 3B shows that a lower capacitor node 306a made of a heavily-doped n+ diffusion region is formed in a lower portion of the deep trench; a capacitor-dielectric layer 307 is then formed over a formed structure surface; an upper capacitor node 308b is formed in a lower portion of the deep trench; and subsequently an ion-implantation is-performed in a self-aligned manner to heavily dope the upper capacitor nodes 308b with a high dose of doping impurities of a second conductivity type. The lower capacitor node 306a is formed by the following steps: depositing an arsenic-silicate-glass (ASG) film over a formed structure surface shown in FIG. 3A, forming an etched-back photoresist layer in a lower portion of the deep trench, removing the arsenic-silicate-glass film over a top surface level of the etched-back photoresist layer, removing the etched-back photoresist layer, forming a capping silicon-dioxide layer over the formed structure surface, performing a drive-in process to diffuse the dopants in the remained arsenic-silicate-glass films into the semiconductor substrate 300 to form the lower capacitor nodes 306a, and removing the capping silicon-dioxide layer and the remained arsenic-silicate-glass films. The capacitor-dielectric layer 307 is preferably made of a composite dielectric layer such as an oxide-nitride-oxide (ONO) structure or a nitride-oxide (NO) structure. The upper capacitor node 308b is preferably made of doped polycrystalline-silicon as deposited by LPCVD and is formed by first forming a planarized doped polycrystalline-silicon layer 308a to fill up each gap formed over the deep trenches and then etching back to form the upper capacitor nodes 308b in the lower portion of the deep trenches.

Figure 3C:
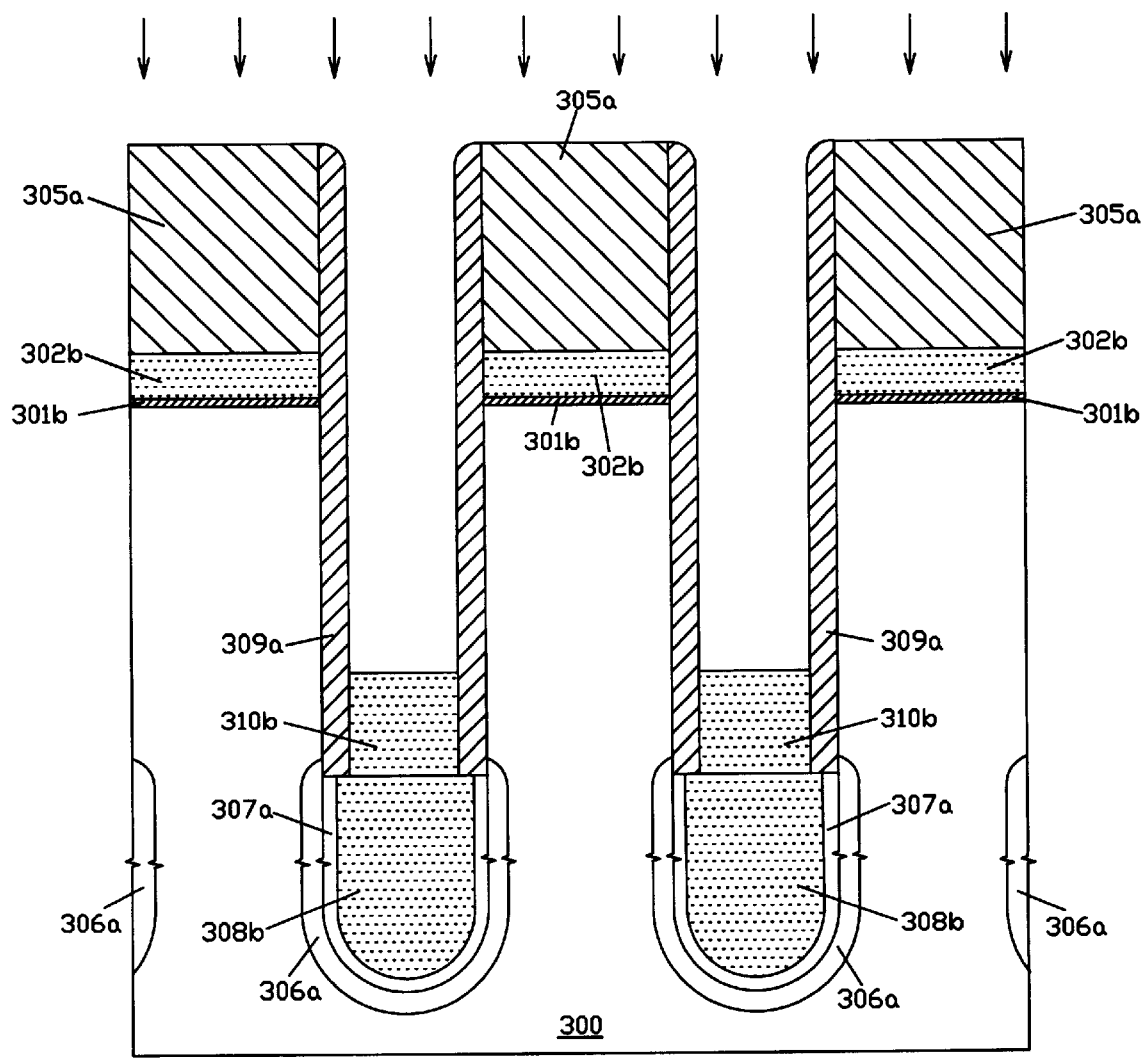

FIG. 3C shows that the capacitor-dielectric layer 307 above a surface level of the upper capacitor node 308b is removed by wet etching or isotropic dry etching; a silicon-dioxide layer 309 is deposited over a formed structure surface and is then etched back a thickness of the deposited silicon-dioxide layer 309 to form a sidewall silicon-dioxide spacer 309a over each sidewall of the deep trenches; a planarized doped polycrystalline-silicon layer 310a is formed to fill up each gap between the sidewall silicon-dioxide spacers 309a and is then etched back to form capacitor-node connectors 310b; and subsequently, an ion-implantation is performed to heavily dope the capacitor-node connectors 310b with a high dose of doping impurities of the second conductivity type.

Figure 3D:
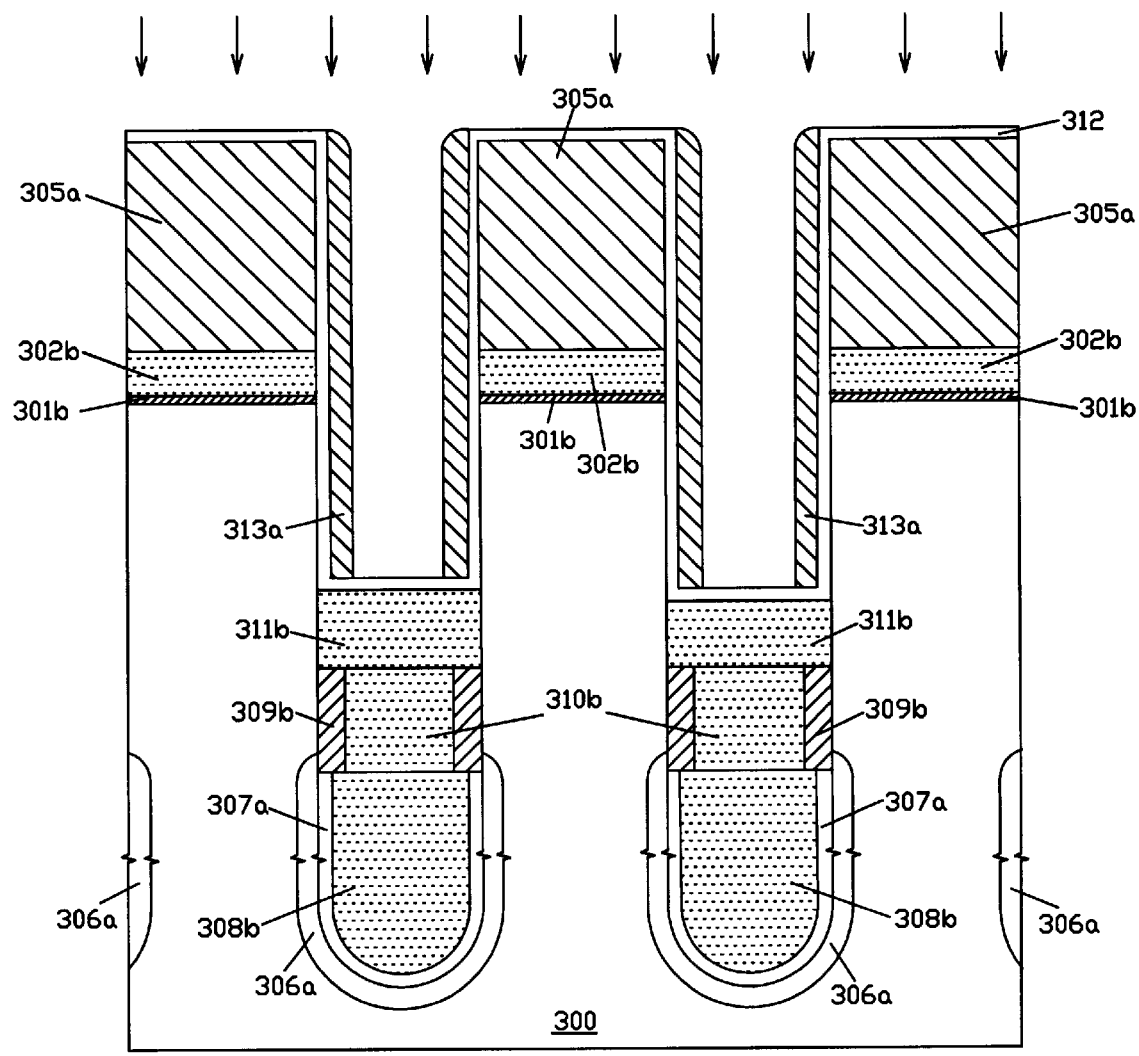

FIG. 3D shows that the sidewall silicon-dioxide spacers 309a above a top surface level of the capacitor-node connector 310b are removed to form a collar-oxide layer 309b in each of the deep trenches by dipping in buffered hydrofluoric acid or dilute hydrofluoric acid solution; a source conductive layer 311b is formed over the collar-oxide layer 309b and the capacitor-node connector 310b; a thin capping silicon-dioxide layer 312 is formed over a formed structure surface; a thin capping silicon-nitride layer 313 is formed over the thin capping silicon-dioxide layer 312 and is etched back to a thickness of the deposited thin capping silicon-nitride layer 313 to form a thin capping silicon-nitride spacer 313a over each sidewall of the thin capping silicon-dioxide layer 312; and subsequently, an ion-implantation is performed to implant a high dose of doping impurities of the second conductivity type into the source conductive layers 311b in a self-aligned manner to act as the dopant diffusion sources for forming common-source diffusion regions 315a in a later process. The source conductive layer 311b is preferably made of doped polycrystalline-silicon or intrinsic polycrystalline-silicon as deposited by LPCVD and is formed by first depositing, then planarizing, and etching back. The thin capping silicon-dioxide layer 312 is preferably deposited by LPCVD or HTO deposition and its thickness is preferably between 50 Angstroms and 150 Angstroms. The thin capping silicon-nitride layer 313 is preferably deposited by LPCVD and its thickness is preferably between 100 Angstroms and 300 Angstroms. It should be noted that the thin capping silicon-dioxide layer 312 is mainly used as a buffer layer to reduce the thermal stress due to the thin capping silicon-nitride spacer 313a and the thin capping silicon-nitride spacer 313a is used to prevent the trench sidewall from oxidation.

Figure 3E:
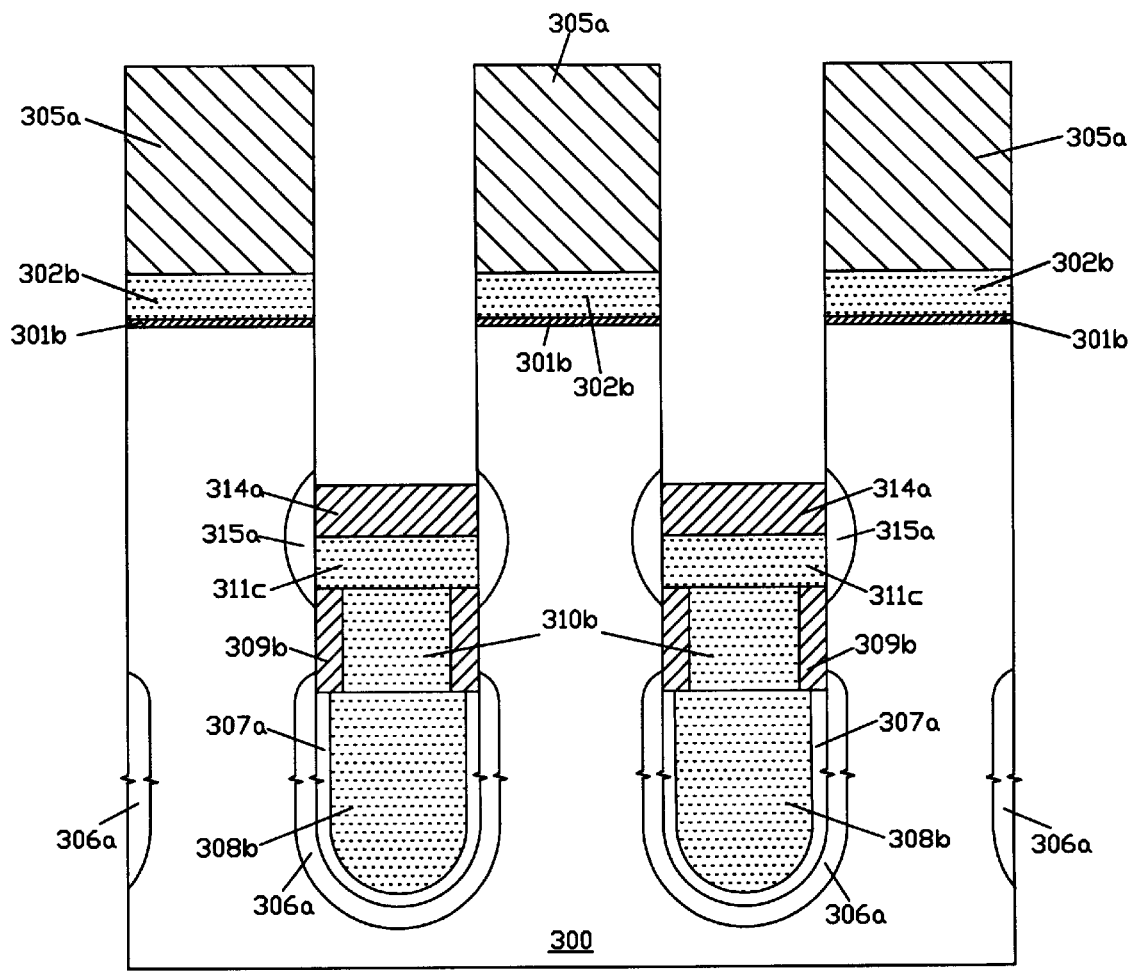

FIG. 3E shows that a thermal-oxidation process is performed to grow an isolation silicon-oxide node 314a over the source conductive node 311c in each of the deep trenches and a common-source diffusion region 315a of the second conductivity type is formed in the semiconductor substrate 300 by out-diffusion of dopant impurities in the source conductive node 311b; and subsequently, the thin in silicon-nitride spacers 313a are removed by using hot-phosphoric acid and the thin capping silicon-oxide layer 312 is then removed by dipping in dilute hydrofluoric acid solution.

Figure 3F:
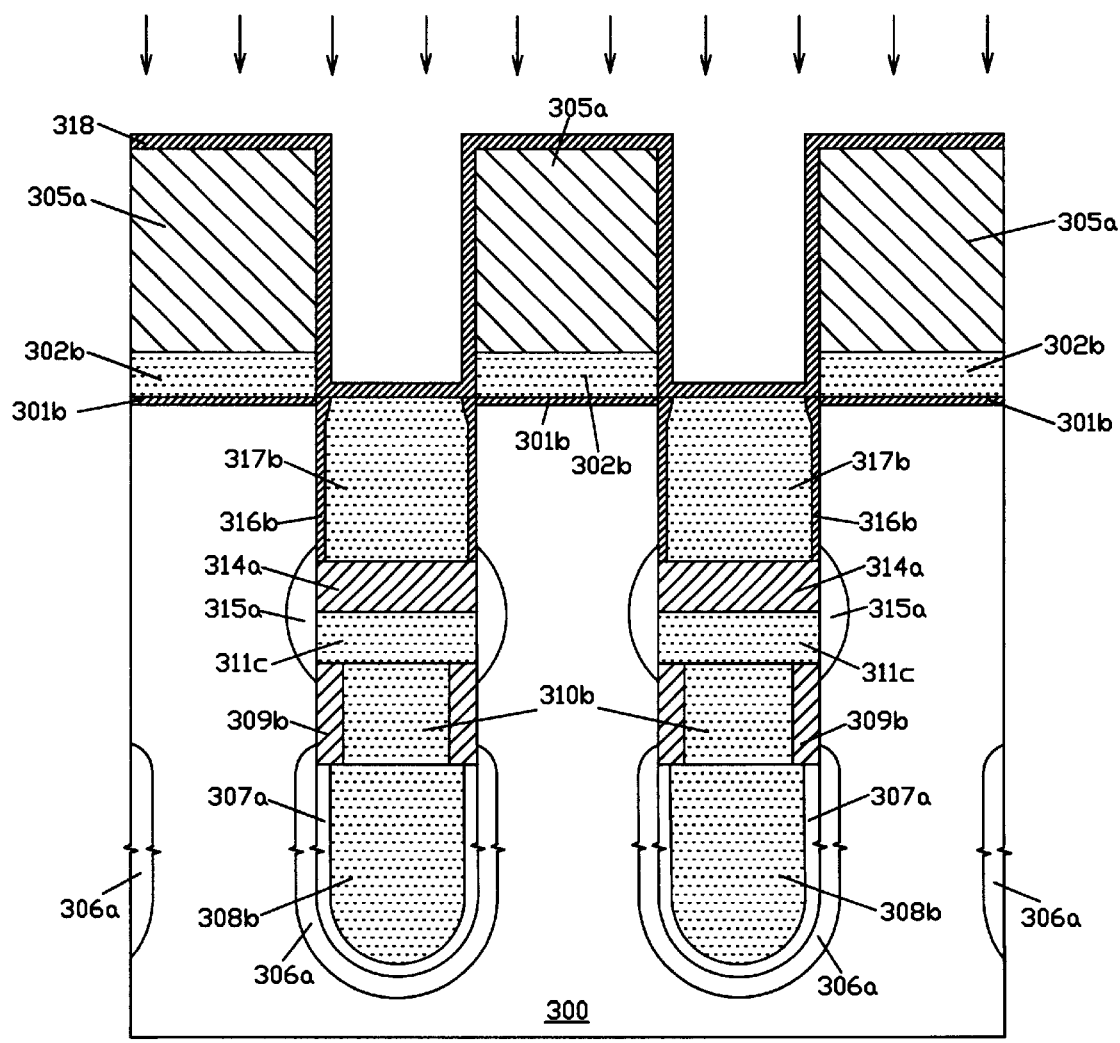

FIG. 3F shows that a gate-dielectric layer 316a is formed over each sidewall of the deep trenches including the first conductive layers 302b, and a conductive-gate node 317b. is formed over the isolation silicon-dioxide node 314a and the gate-dielectric layer 316a; the first-type second raised field-oxide layers 304c in the first-type STI regions are etched back to the same surface level of the conductive-gate nodes 317b to form first-type third raised field-oxide layers 304d; and subsequently, a protective silicon-dioxide layer 318 is formed over a formed structure surface, and an ion-implantation is preformed in a self-aligned manner by implanting a high-dose of doping impurities of the second conductivity type across the protective silicon-oxide layers 318 into the conductive-gate nodes 317b. The gate-dielectric layer 316a is preferably a thermal-oxide layer or a nitrided thermal-oxide layer and its thickness is preferably between 15 Angstroms and 150 Angstroms. The conductive-gate node 317b is preferably made of doped polycrystalline-silicon as deposited by LPCVD and is formed by first depositing a doped polycrystalline-silicon film 317 over a gap between the second masking-dielectric layers 305a, planarizing the deposited doped polycrystalline-silicon film 317 using CMP with the second masking dielectric layer 305a as a polishing stop, and then etching back the planarized doped polycrystalline-silicon layers 317a to a depth approximately equal to a top surface level of the first dielectric layer 301b. The protective silicon-dioxide layer 318 is preferably deposited by LPCVD and its thickness is preferably between 100 Angstroms and 300 Angstroms to protect the channel region in the semiconductor substrate 300 from ion-implantation.

Figure 4A:
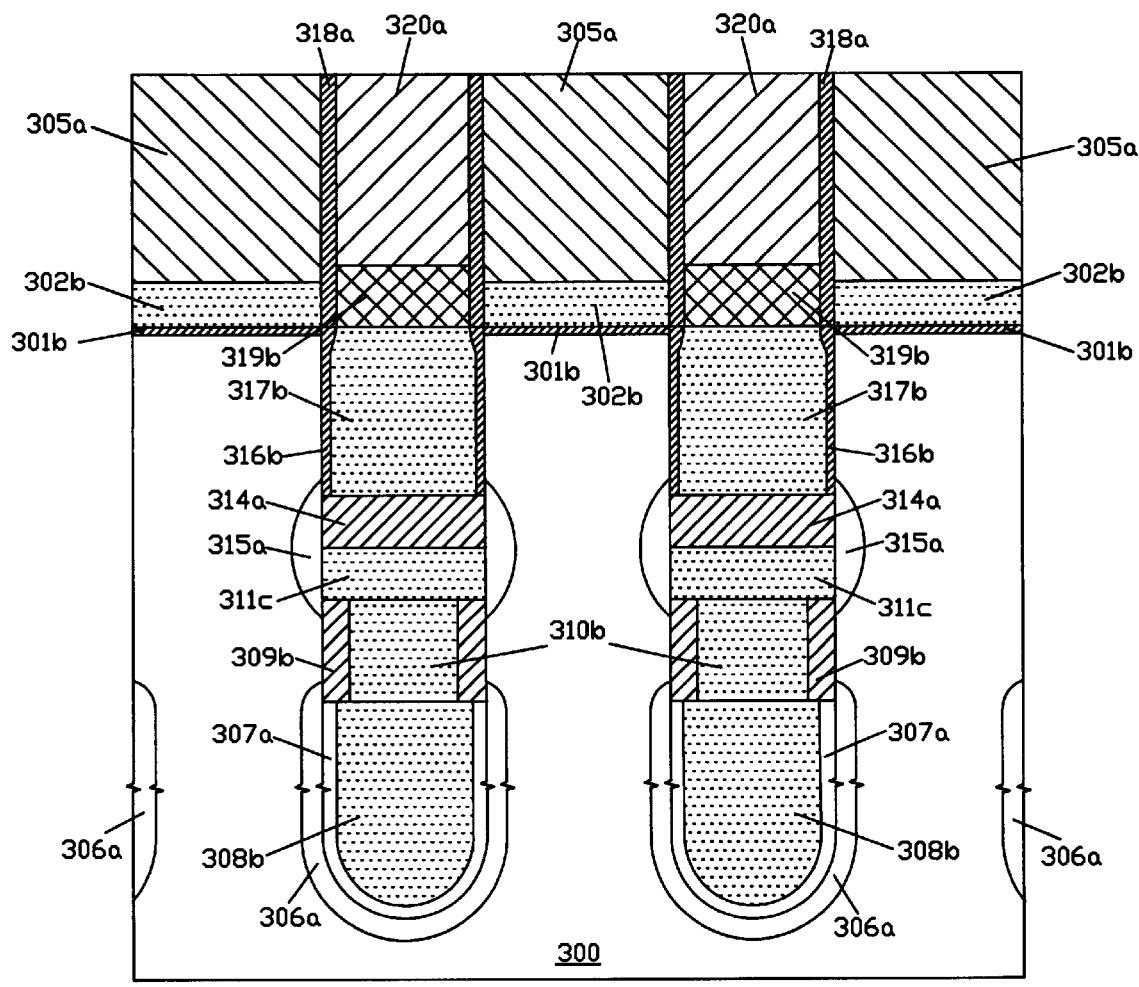
FIG. 4A through FIG. 4F show the process steps and their cross-sectional views of fabricating a first-type vertical transistor DRAM structure and its first-type contactless vertical transistor DRAM array of the present invention.

Referring now to FIG. 4A through FIG. 4F, there are shown the process steps and their cross-sectional views for forming a first-type vertical transistor DRAM array of the present invention. FIG. 4A shows that the protective silicon-dioxide layer 318 is etched back to a thickness of the protective silicon-dioxide layer 318 to form a pair of first sidewall silicon-dioxide spacers 318a in each of the plurality of deep trench regions; a conductive word-line 319b is then formed between the pair of first sidewall silicon-dioxide spacers 318a and on a flat surface being alternately formed by the conductive-gate node 317b and the first-type third raised field-oxide layer 304d; and subsequently, a first planarized thick-oxide layer 320a is formed over each of the conductive word-lines 319b. The conductive word-line 319b is preferably made of tungsten-disilicide ($WSi_2$) or tungsten (W) as deposited by LPCVD or sputtering and is formed by first depositing a thick conductive layer 319 to fill up each gap formed between the pair of first sidewall silicon-dioxide spacers 318a, planarizing the deposited thick conductive layer 319 by using CMP with the second masking dielectric layer 305a as a polishing stop, and then etching back to a predetermined depth. The first planarized thick-oxide layer 320a is preferably made of silicon-dioxide, P-glass, or BP-glass as deposited by LPCVD, HDPCVD or PECVD.

Figure 4B:
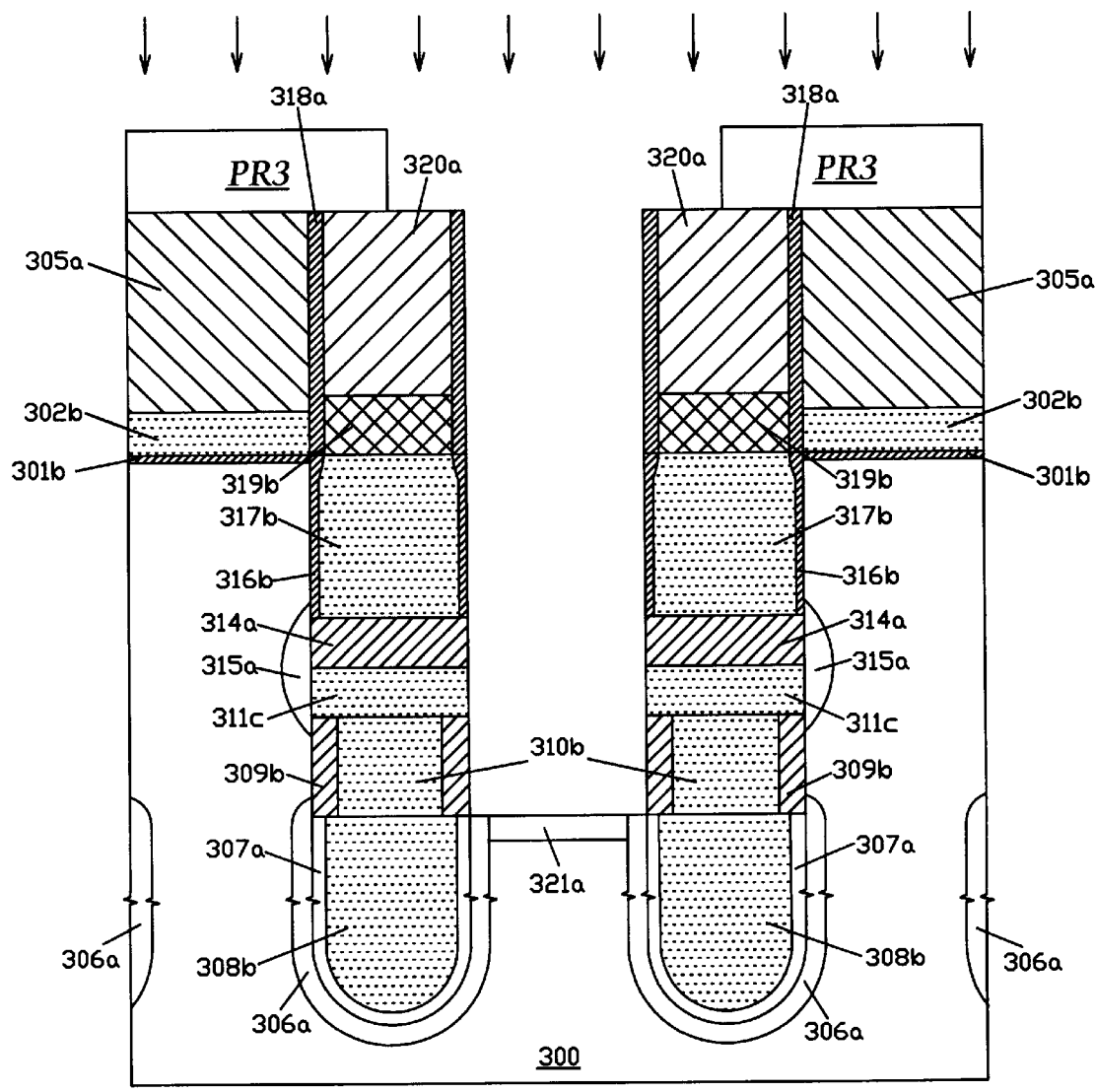

FIG. 4B shows that a plurality of masking photoresist (PR3) are formed over the common-drain regions and a portion of nearby deep-trench regions, and the second masking dielectric layers 305a between the plurality of masking photoresist (PR3) are selectively removed by anisotropic dry etching; the first conductive layers 302b and the first dielectric layers 301b are sequentially removed by anisotropic dry etching; and subsequently, the exposed semiconductor substrates 300 are anisotropically etched to a depth approximately equal to a bottom surface level of the collar-oxide layer 309b for forming second-type STI regions (STI-2) and an ion-implantation can be performed by implanting a high dose of doping impurities into the semiconductor substrate 300 in a self-aligned manner to form the implant regions 321a of the second conductivity type, and then the plurality of masking photoresist (PR3) are stripped. It should be noted that the implant region 321a is connected with the lower capacitor nodes 306a of nearby trench capacitors.

Figure 4C:
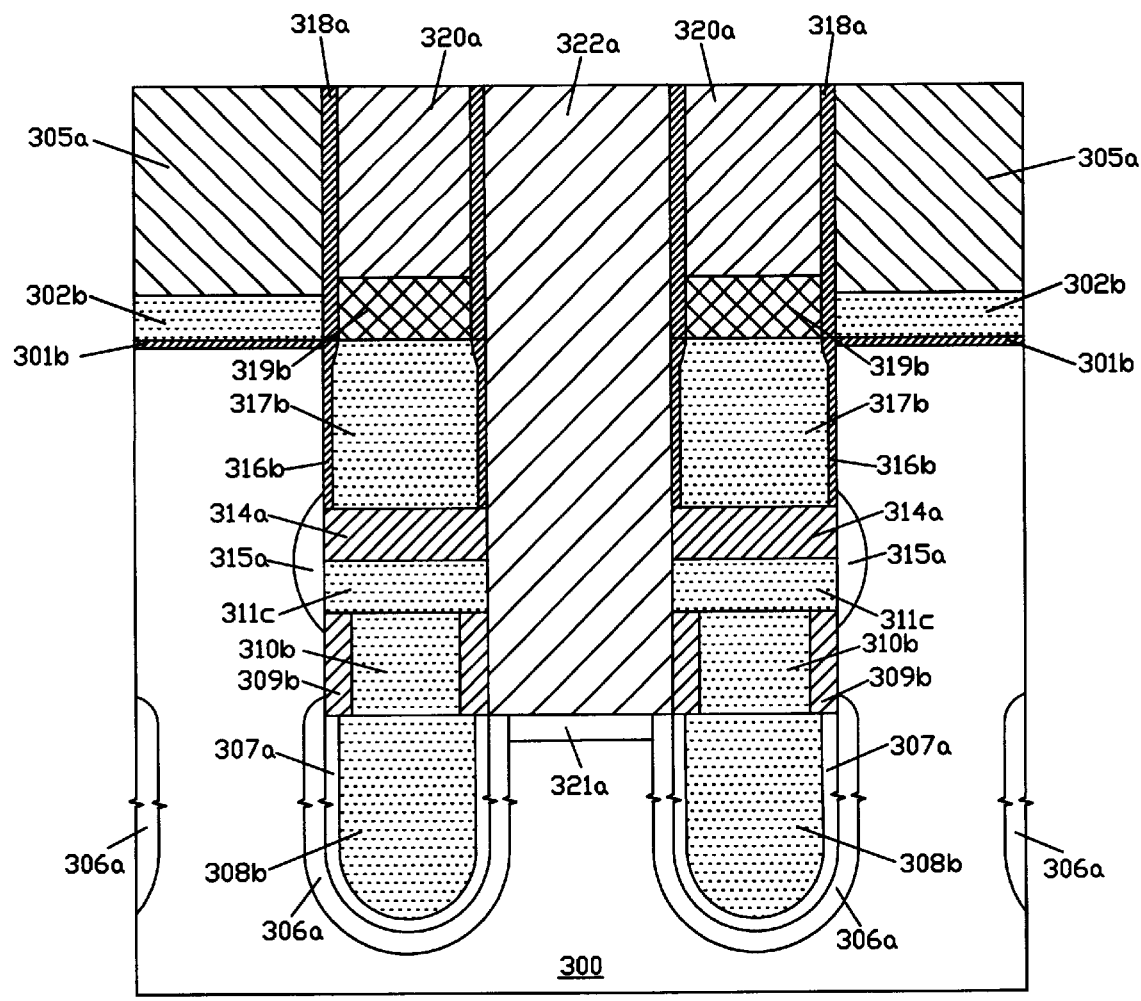

FIG. 4C shows that a second-type planarized field-oxide layer 322a is formed over a gap between nearby deep-trench regions. The second-type planarized field-oxide layer 322a is preferably made of silicon-dioxide, glass, or BP-glass as deposited by LPCVD, HDPCVD, or PECVD.

Figure 4D:
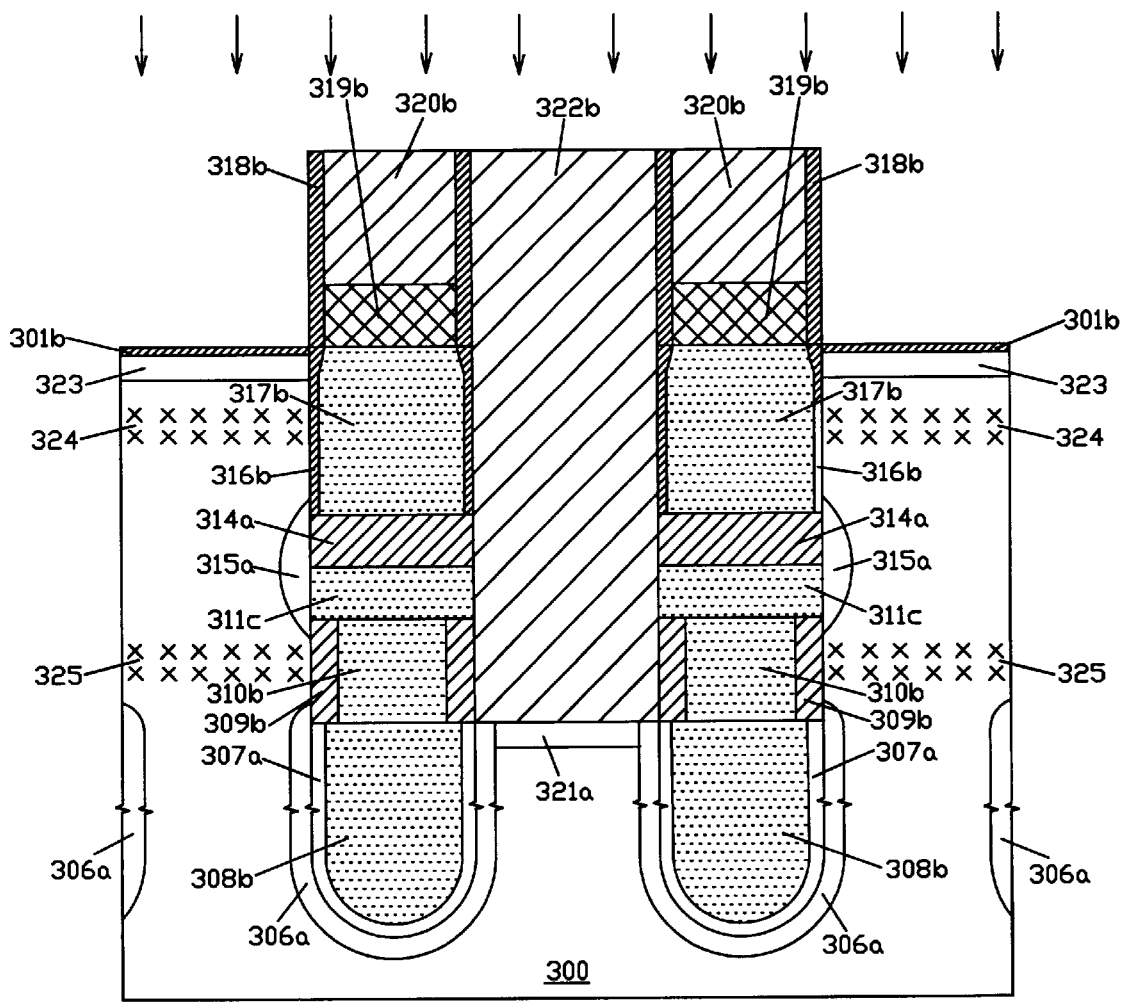

FIG. 4D shows that the second masking dielectric layers 305a over the common-drain regions are removed by hot-phosphoric acid or anisotropic dry etching; the formed structure including various silicon-dioxide layers is then etched back anisotropically to a depth equal to a thickness of the first conductive layer 302b, and the first conductive layers 302b are removed by anisotropic dry etching to form a flat surface being alternately formed by a first dielectric layer 301b and a first-type fourth raised field-oxide layer 304e; and subsequently, different implant regions can be formed in the semiconductor substrate 300 in a self-aligned manner by implanting doping impurities across the first dielectric layers 301b. The different implant regions may comprise a common-drain diffusion region 323 of the second conductivity type being formed in an upper surface region of the semiconductor substrate 300, a deep implant region 324 of the first conductivity type being formed in the semiconductor substrate 300 near a central portion outside of the gate-dielectric layer 316b, and a deeper implant region 325 of the first conductivity type being formed in the semiconductor substrate 300 near a central portion outside of the collaroxide layer 309b in each of the plurality of active regions. The common-drain diffusion region 323 may comprise a shallow heavily-doped diffusion region 323b being formed within a lightly-doped diffusion region 323a (not shown). The deep implant region 324 is mainly used to form a punch-through stop and to simultaneously adjust a threshold voltage of the vertical transistor. The deeper implant region 325 is also used to form a punch-through stop and to simultaneously adjust a threshold-voltage of the parasitic collar-oxide transistor. It is clearly seen that the channel length of the vertical transistor can be shortened to obtain a lower on-resistance for high-speed read and write operation and a lower off-current for longer retention. Similarly, the separation between the common-source diffusion region 315a and the lower capacitor node 306a can be made to be smaller without concerning the punch-through effect. Accordingly, the depth of the deep trenches can be made to shallower for the present invention as compared to the prior art.

Figure 4E:
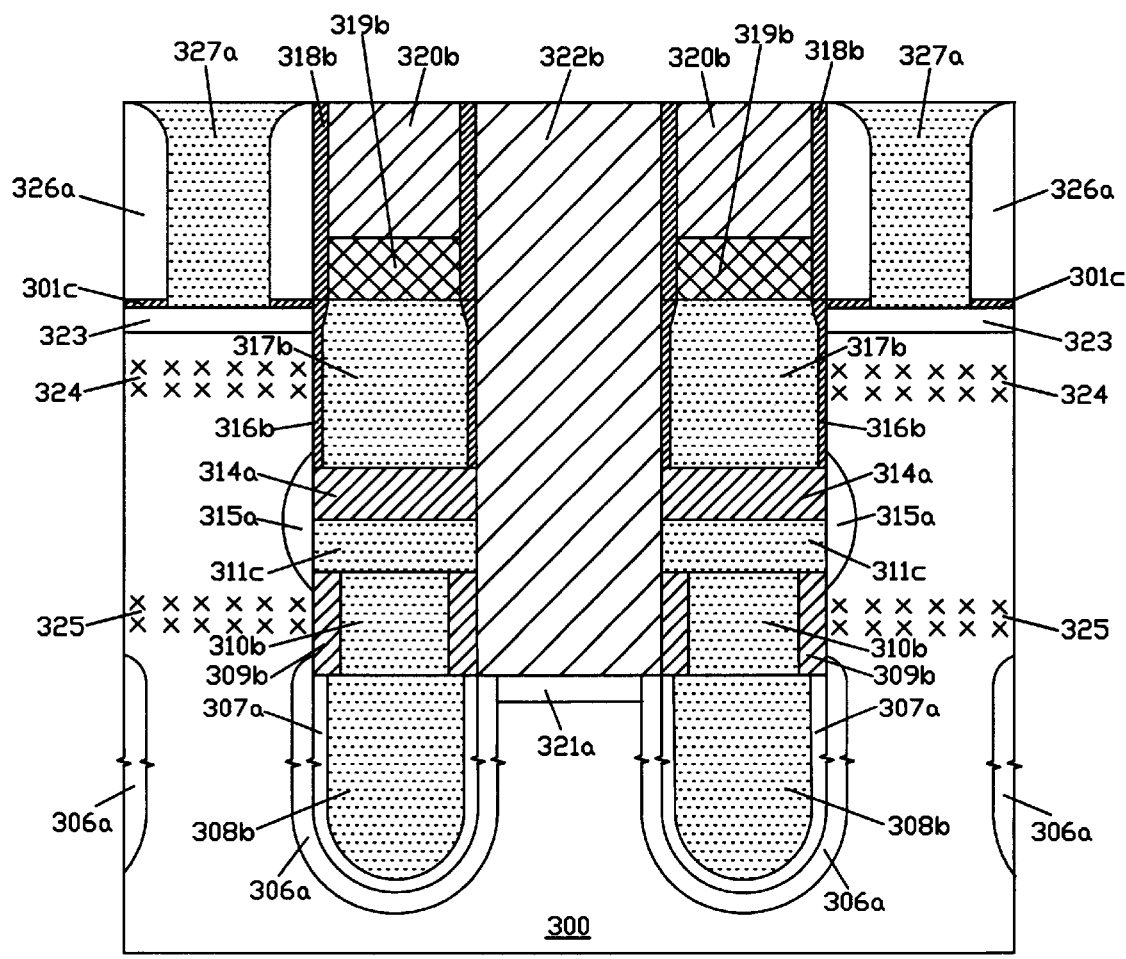

FIG. 4E shows that a pair of third sidewall dielectric spacers 326a are formed over each sidewall of nearby first sidewall silicon-oxide spacers 318b and on a portion of the flat surface being alternately formed by the first dielectric layer 301b and the first-type fourth raised field-oxide layer 304e; the first dielectric layers 301b between the pair of third sidewall dielectric spacers 326a are removed by dipping in dilute hydrofluoric acid and the first-type fourth raised field-oxide layers 304e are simultaneously etched to form a flat bed being alternately formed by the common-drain diffusion region 323 and a first-type fifth raised field-oxide layer 304f; and subsequently, a planarized common-drain conductive layer 327a is formed over the flat bed between the pair of third sidewall dielectric spacers 326a in each of the common-drain regions. The third sidewall dielectric spacer 326a is preferably made of silicon-dioxide, silicon-nitride, or silicon-oxynitride. The planarized common-drain conductive layer 327a is preferably made of doped polycrystalline-silicon and is further heavily implanted with a high-dose of doping impurities of the second conductivity type. The planarized common-drain conductive layer 327a can be silicided with a refractory metal-silicide layer such as a titanium-disilicide ($TiSi_2$) or cobalt-disilicide ($CoSi_2$) layer. Similarly, the planarized common-drain conductive layer 327a may comprise a planarized tungsten layer being lined with a barrier-metal layer such as a titanium-nitride (TiN) or tantalum-nitride (TaN) layer.

Figure 4F:
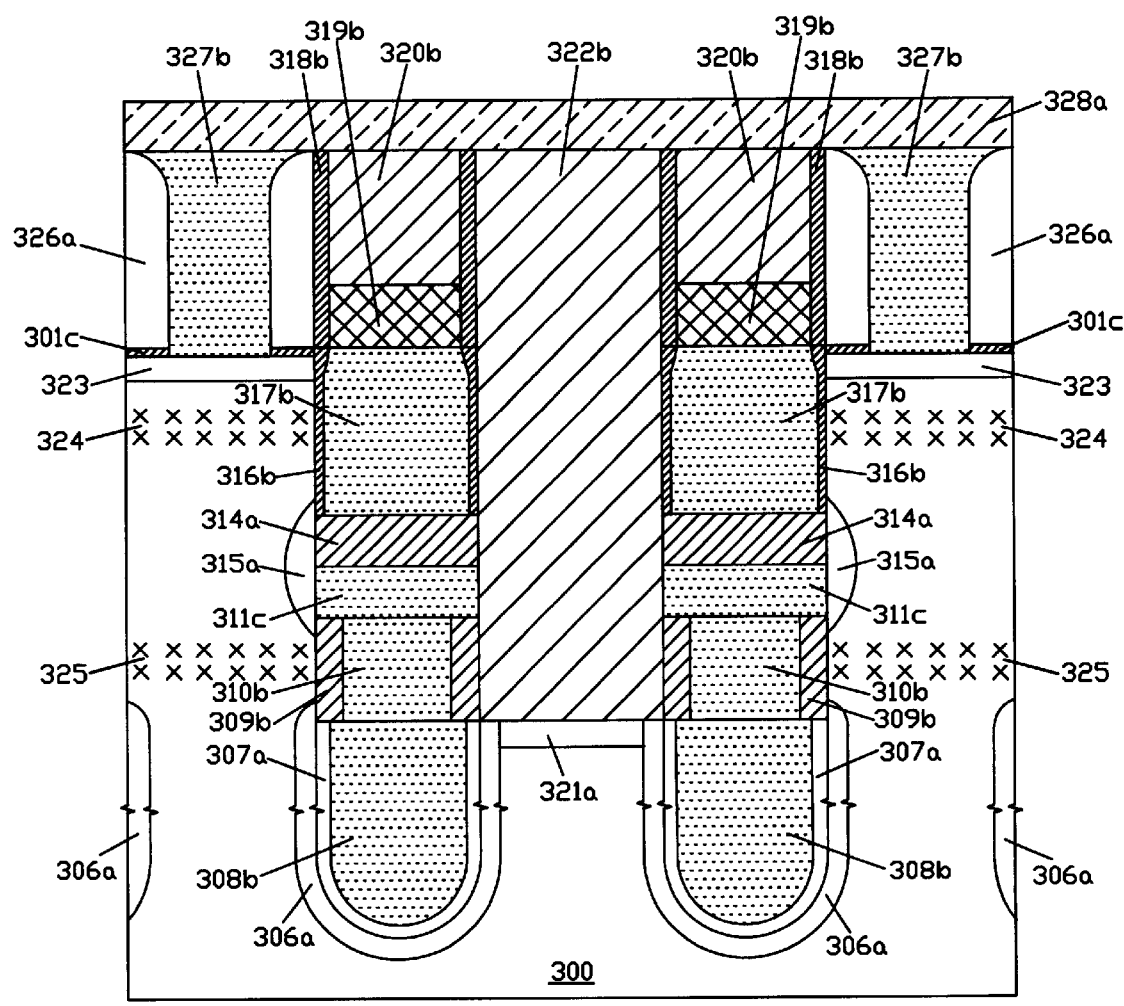

FIG. 4F shows that a metal layer 328 is formed over a formed structure surface shown in FIG. 4E; the metal layer 328 and the planarized common-drain conductive layers 327a are simultaneously patterned and etched by a masking photoresist step to form a plurality of metal bit-lines 328a integrated with planarized common-drain conductive islands 327b being aligned above the plurality of active regions. The metal layer 328 comprises an aluminum or copper layer over a barrier-metal layer. The mask photoresist step comprises a plurality of masking photoresist being aligned above the plurality of active regions or a plurality of hard masking dielectric layers being aligned above the plurality of active regions and a sidewall dielectric spacer being formed over each sidewall of the plurality of hard masking dielectric layers to eliminate misalignment. FIG. 4F shows a first-type vertical transistor DRAM structure and its first-type contactless vertical transistor DRAM array of the present invention.

Figure 4G:
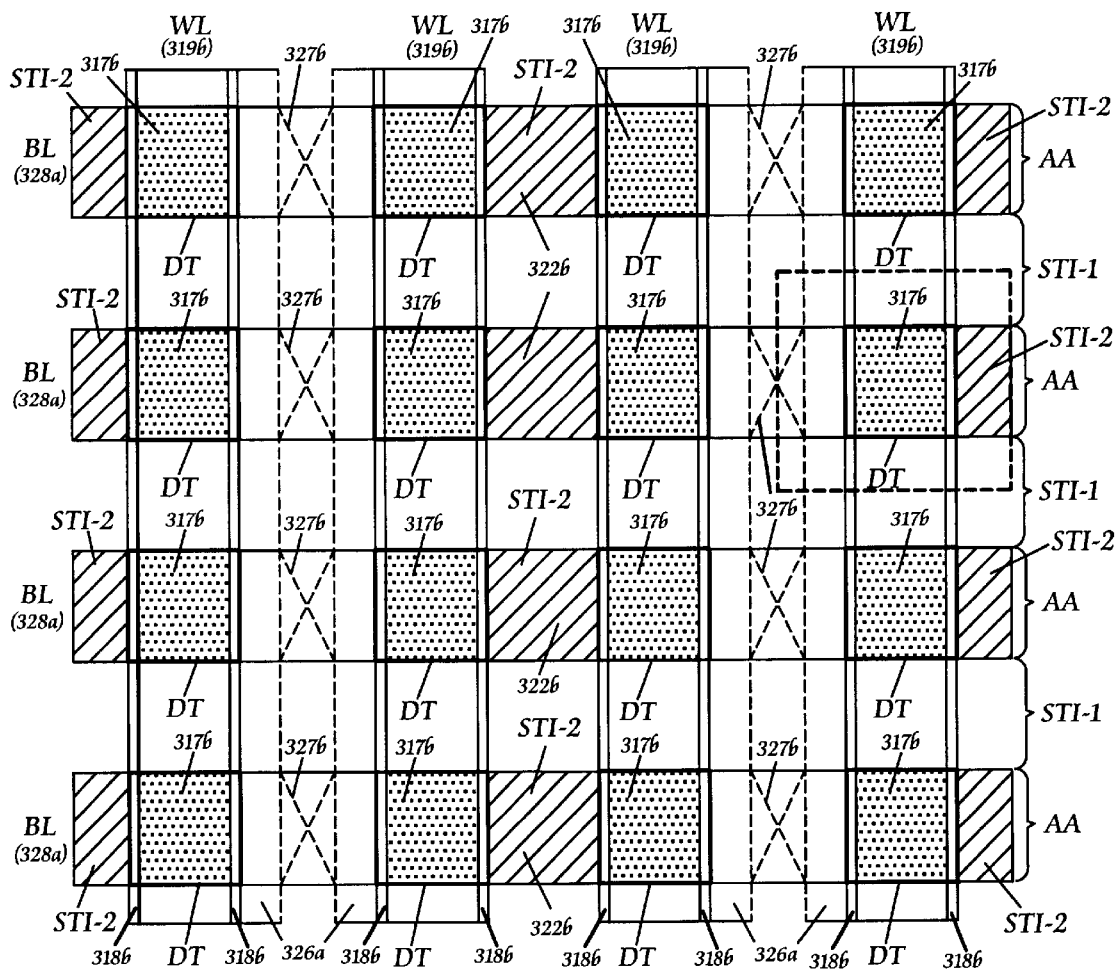
FIG. 4G shows a top plan view of a first-type contactless vertical transistor DRAM array of the present invention.

FIG. 4G shows a top plan view of the first-type contactless vertical transistor DRAM array, in which the plurality of metal bit-lines (BL) 328a integrated with the planarized common-drain conductive islands 327b are formed to be aligned above -the plurality of active regions (AA), wherein the planarized common-drain conductive islands 327b are formed over the common-drain diffusion regions 323 between the pair of third sidewall dielectric spacers 326a; the plurality of first-type STI regions (STI-1) and the plurality of active regions (AA) are formed alternately on said semiconductor substrate 300; the plurality of conductive word-lines (WL) 319b integrated with the conductive-gate nodes 317b are formed between the pair of first sidewall silicon-dioxide spacers 318b, wherein the conductive-gate node 317b is formed in the deep trench (DT) between the pair of first sidewall silicon-dioxide spacers 318b; and the second-type STI region (STI-2) being filled with the second-type second raised field-oxide layer 322b is formed in the active region between the pair of first sidewall silicon-dioxide spacers 318b. From FIG. 4G, the unit cell size as marked by a dash square can be made to be equal to $4F^2$ if the size of the deep trench is equal to $1.0F^2$.

Figure 5A:
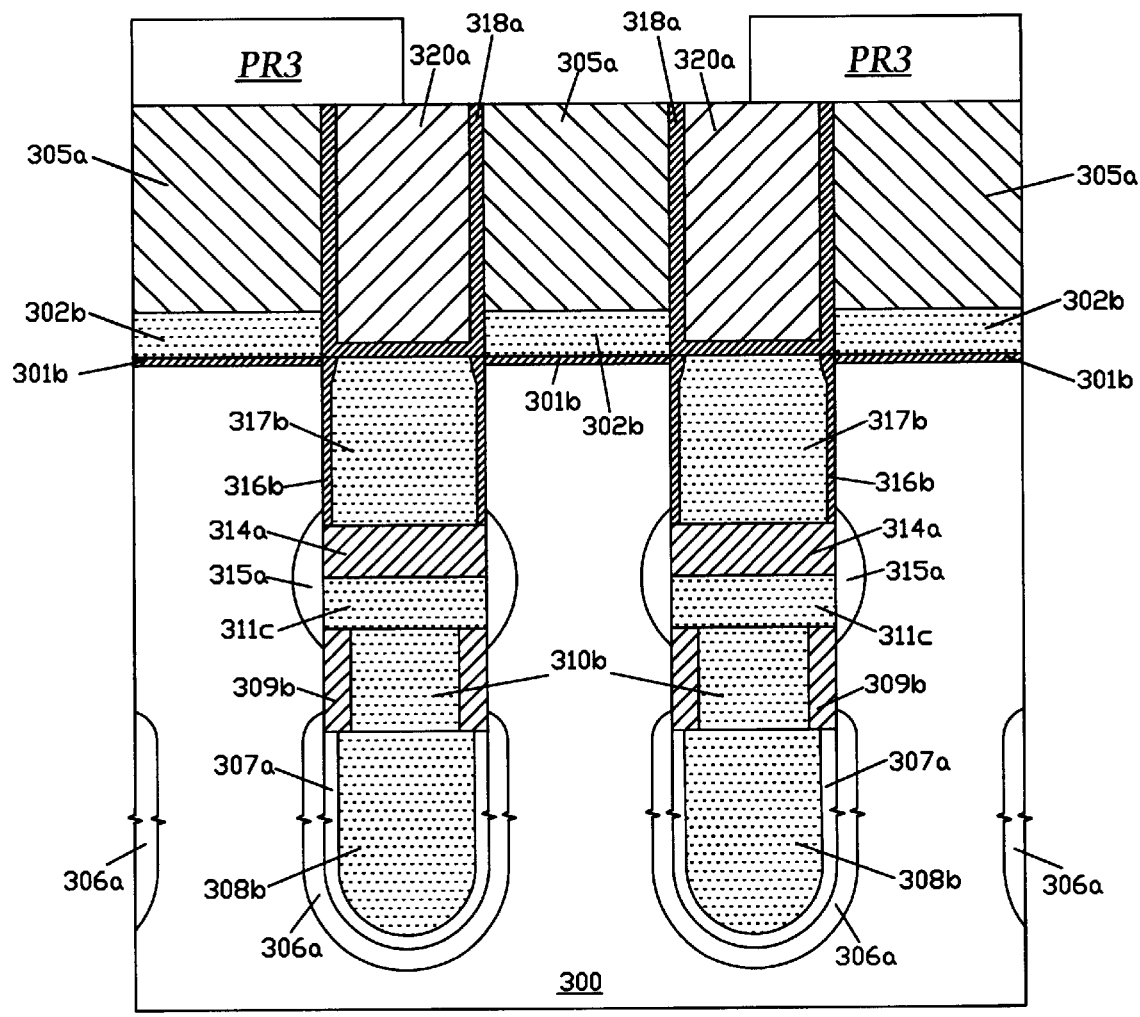
FIG. 5A through FIG. 5F show the process steps and their cross-sectional views of fabricating a second-type vertical transistor DRAM structure and its second-type contactless vertical transistor DRAM array of the present invention.

Referring now to FIG. 5A through FIG. 5F, there are shown the process steps and their cross-sectional views for forming a second-type vertical transistor DRAM structure and its second-type contactless vertical transistor DRAM array after FIG. 3F. FIG. 5A shows a first planarized thick-oxide layer 320a is formed to fill up a gap in each of the plurality of deep-trench regions and the plurality of masking photoresist (PR3) as described in FIG. 4B are formed.

Figure 5B:
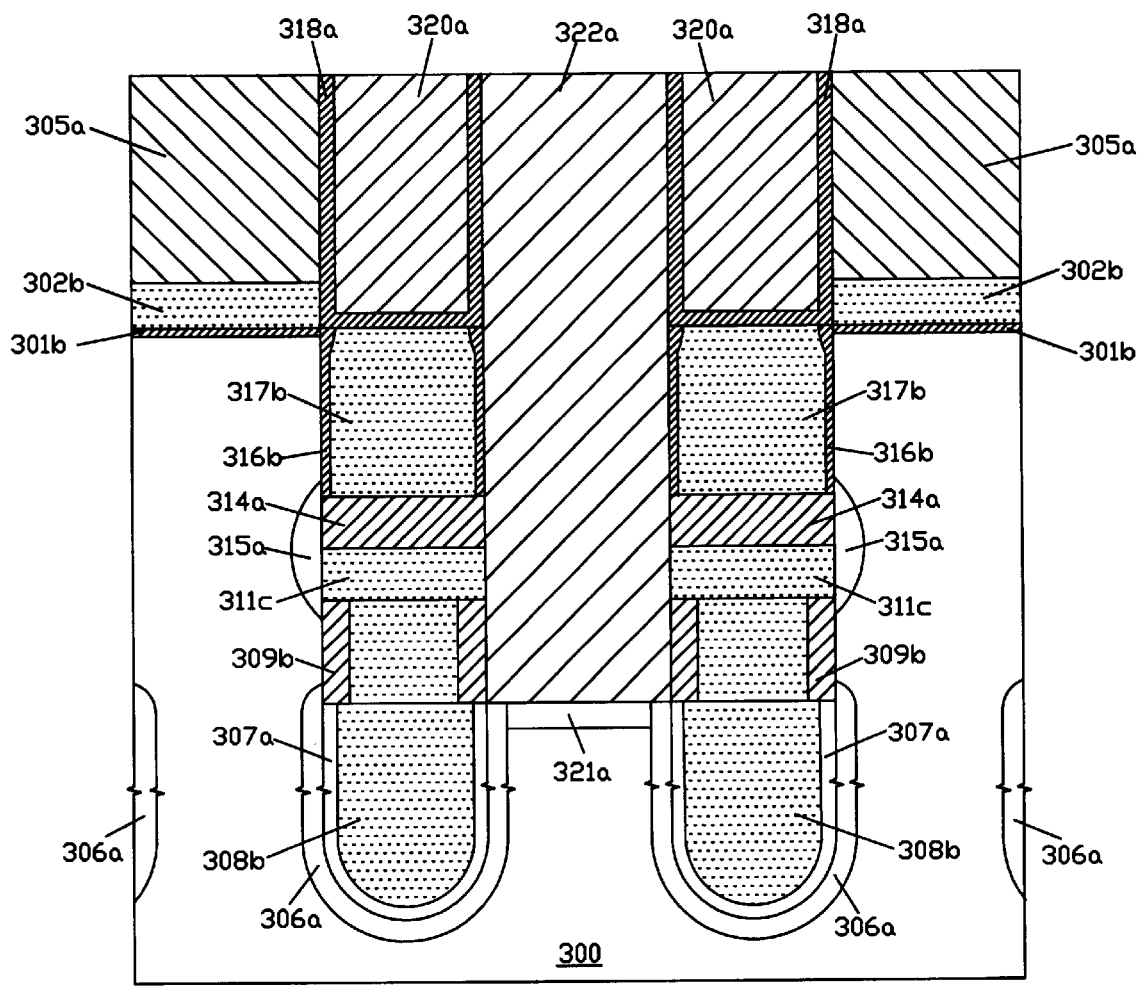

FIG. 5B shows that the second masking dielectric layers 305a outside of the plurality of masking photoresist (PR3) are selectively removed; a plurality of second-type STI regions are formed and refilled with the second-type planarized field-oxide layers 322a, wherein a heavily-implanted region 321a of the second conductivity type is formed in said semiconductor substrate 300 of the active region and is located under the second-type planarized field-oxide layer 322a; and the plurality of masking photoresist (PR3) are stripped.

Figure 5C:
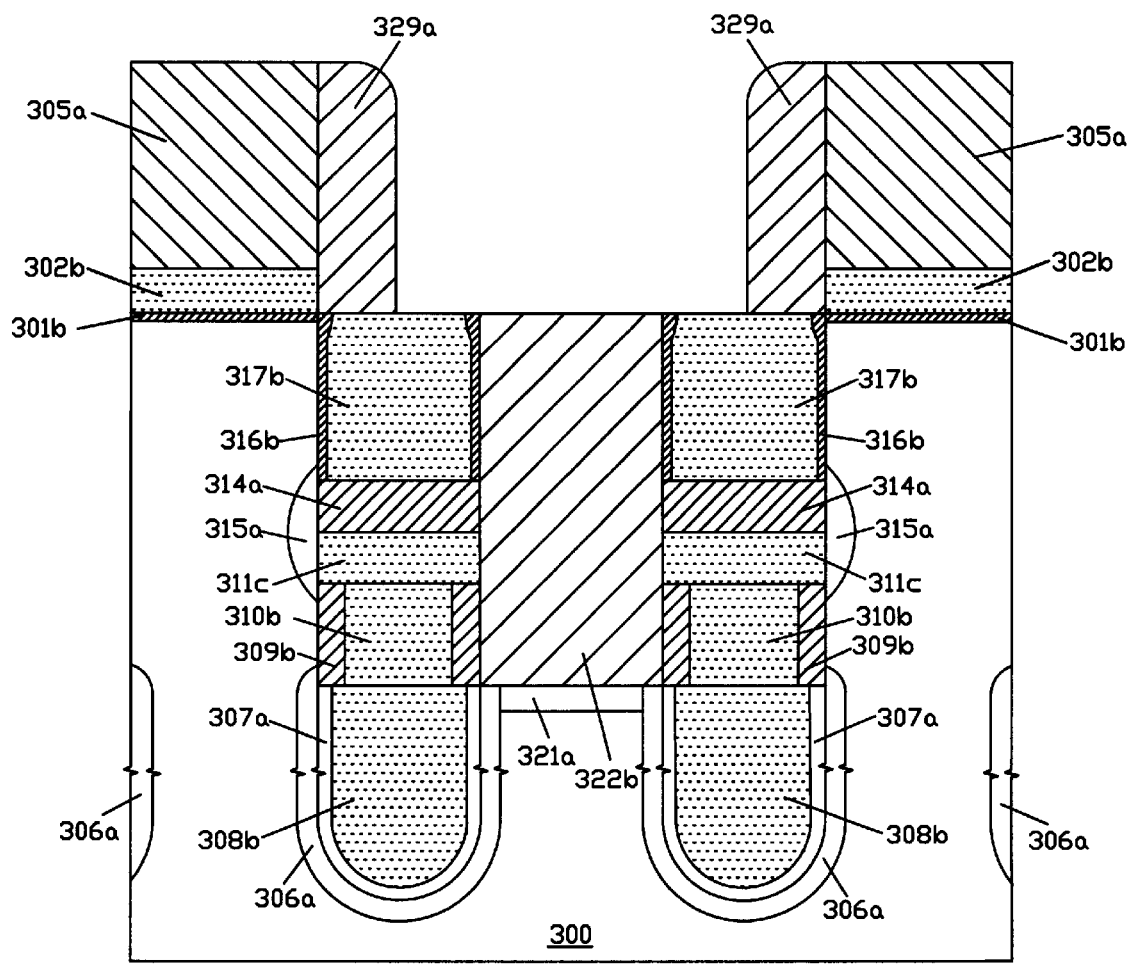

FIG. 5C shows that the oxide layers including the protective silicon-dioxide layers 318a, the first planarized thick-oxide layers 320a, and the second-type planarized field-oxide layers 322a between the second masking dielectric layers 305a are selectively etched back to a top surface level of the conductive-gate node 317b by using anisotropic dry etching; and a pair of second sidewall dielectric spacers 329a are formed over each sidewall of nearby second masking dielectric layers 305a and on a portion of a flat surface being alternately formed by the conductive-gate node 317b and a first-type third raised field-oxide layer 304d. The second sidewall dielectric spacer 329a is preferably made of silicon-dioxide as deposited by LPCVD.

Figure 5D:
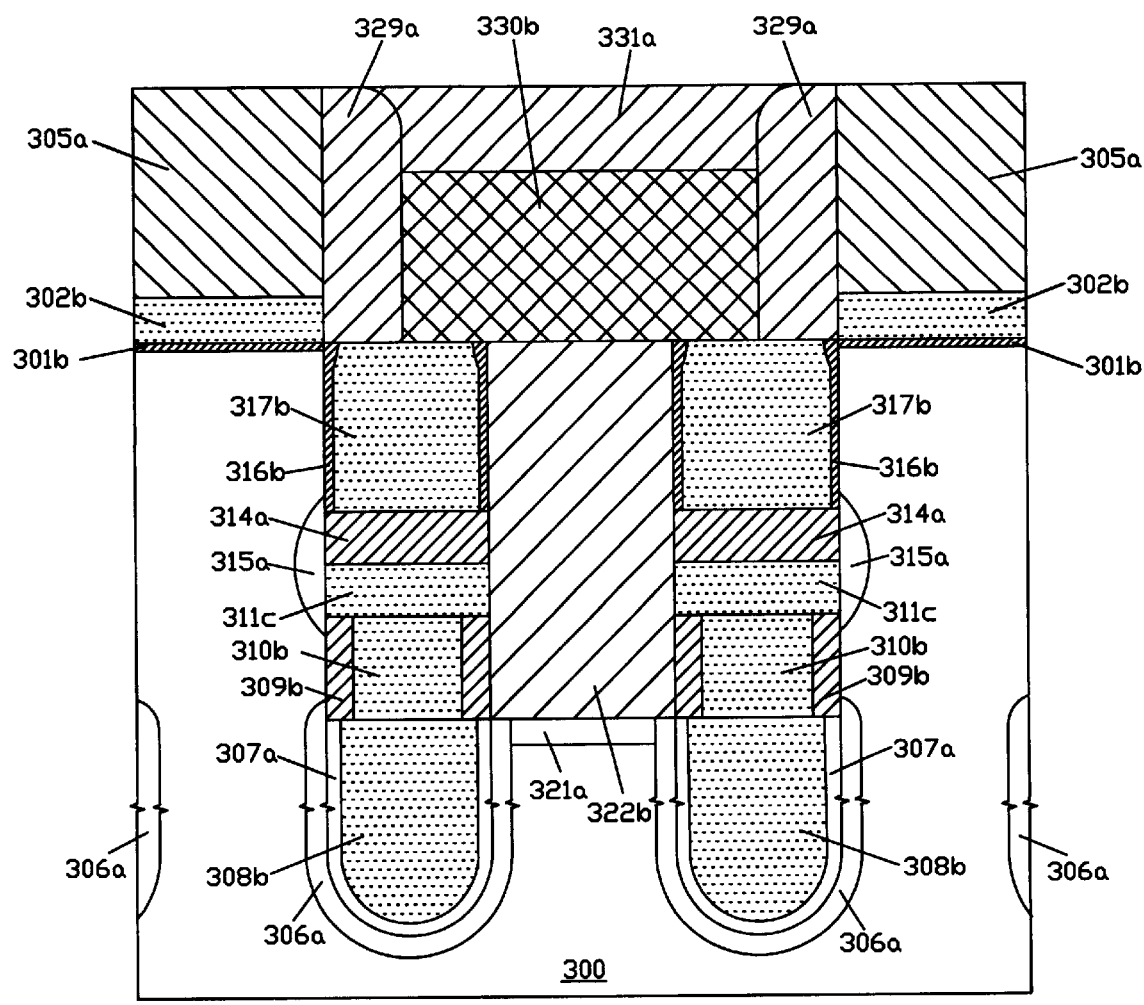

FIG. 5D shows that a planarized common-gate conductive layer 330b is formed between the pair of second sidewall dielectric spacers 329a and a planarized capping silicon-dioxide layer 331a is formed over the planarized common-gate conductive layer 330b between the pair of second sidewall dielectric spacers 329a. The planarized common-gate conductive layer 330b comprises a tungsten (W) or tungsten-disilicide ($WSi_2$) layer as deposited by LPCVD or sputtering and is formed by first depositing a thick conductive layer 330 to fill up a gap between the pair of second sidewall dielectric spacers 329a, then planarizing the deposited thick conductive layer 330 using CMP to form a planarized conductive layer 330a, and etching back said planarized conductive layer 330a to a depth larger than a thickness of the first conductive layer 302b. The planarized capping silicon-dioxide layer 331a is preferably made of silicon-dioxide, P-glass, or BP-glass as deposited by LPCVD, HDPCVD, or PECVD, and is formed by first depositing a capping thick-oxide layer 331 and then planarizing the deposited capping thick-oxide layer 331 using CMP with the second masking dielectric layer 305a as a polishing stop.

Figure 5E:
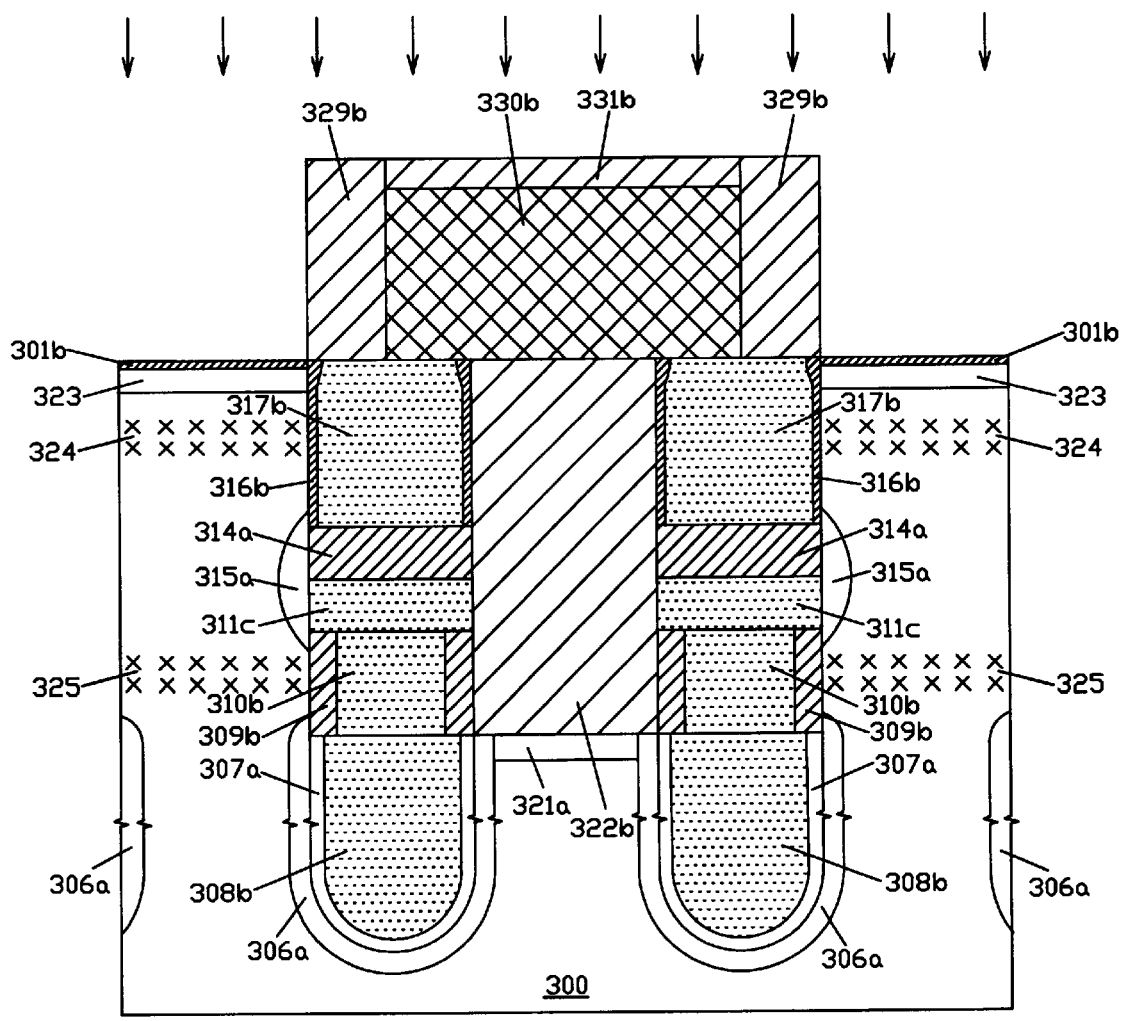

FIG. 5E shows that the second masking dielectric layers 305a in the common-drain regions are selectively removed by hot-phosphoric acid or anisotropic dry etching and an etching-back process is performed to anisotropically etch the first-type first raised field-oxide layers 304b, the pair of second sidewall dielectric spacers 329a, and the planarized capping silicon-dioxide layers 331a to a depth equal to a thickness of the first conductive layer 302b, and the first conductive layers 302b are removed to form a flat surface being alternately formed by the first dielectric layer 301b and a first-type fourth raised field-oxide layer 304e; and subsequently, different implant regions are formed in the semiconductor substrate 300 of each of the plurality of active regions in each of the common-drain regions. The different implant regions may comprise a common-drain diffusion region 323 of the second conductivity type being formed in an upper surface portion of the semiconductor substrate 300, a deep implant region 324 of the first conductivity type being formed in the semiconductor substrate 300 near a central portion of the gate-dielectric layer 316b, and a deeper implant region 325 of the first conductivity type being formed in the semiconductor substrate 300 near a central portion of the collar-oxide layer 309b. The common-drain diffusion region 323 may comprise a shallow heavily-doped diffusion region 323b being formed within a lightly-doped diffusion region 323a.

Figure 5F:
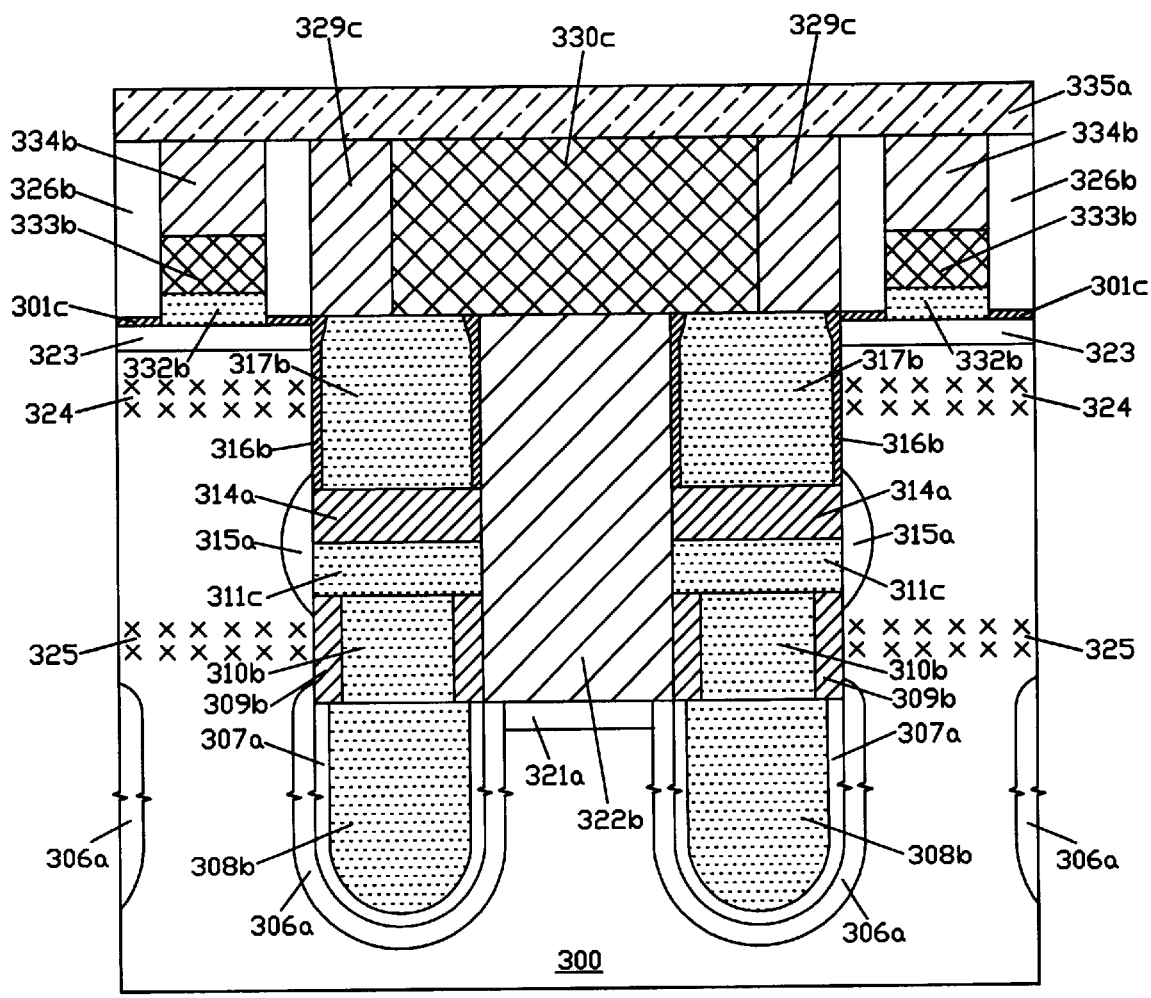

FIG. 5F shows that a pair of third sidewall dielectric spacers 326a are formed over each sidewall of nearby second sidewall dielectric spacers 329b; the first dielectric layers 301b between the pair of third sidewall dielectric spacers 326a are removed by dipping in dilute hydrofluoric acid solution or anisotropic dry etching, and the first-type fourth raised field-oxide layers 304e are simultaneously etched to form a flat bed between the pair of third sidewall dielectric spacers 326a in each of the common-drain regions; a doped polycrystalline-silicon layer 332b capped with a tungsten-disilicide ($WSi_2$) or tungsten (W) layer 333b or silicided with a refractory metal-silicide layer 333b such as a titanium-disilicide ($TiSi_2$) or cobalt-disilicide ($CoSi_2$) layer are formed over the flat bed to act as a conductive bit-line 333b/332b; a second planarized thick-oxide layer 334a is formed over the conductive bit-line 333b/332b in each of the common-drain regions; the formed structure is then etched back to a depth equal to a thickness of the etched-back planarized capping silicon-dioxide layer 331b; and a metal layer 335 together with the planarized common-gate conductive layers 330b are simultaneously patterned by a masking photoresist step to form the plurality of metal word-lines 335a integrated with planarized common-gate conductive islands 330c. The third sidewall dielectric spacer 326a is preferably made of silicon-dioxide as deposited by LPCVD. The second planarized thick-oxide layer 334a is preferably made of silicon-dioxide, P-glass, or BP-glass as deposited by LPCVD, HDPCVD or PECVD. The doped polycrystalline-silicon layer 332b is preferably deposited by LPCVD and is further implanted with a high-dose of doping impurities of the second conductivity type. The metal layer 335 may comprise an aluminum or copper layer over a barrier-metal layer such as a titanium-nitride (TiN) or tantalum-nitride (TaN) layer.

Figure 5G:
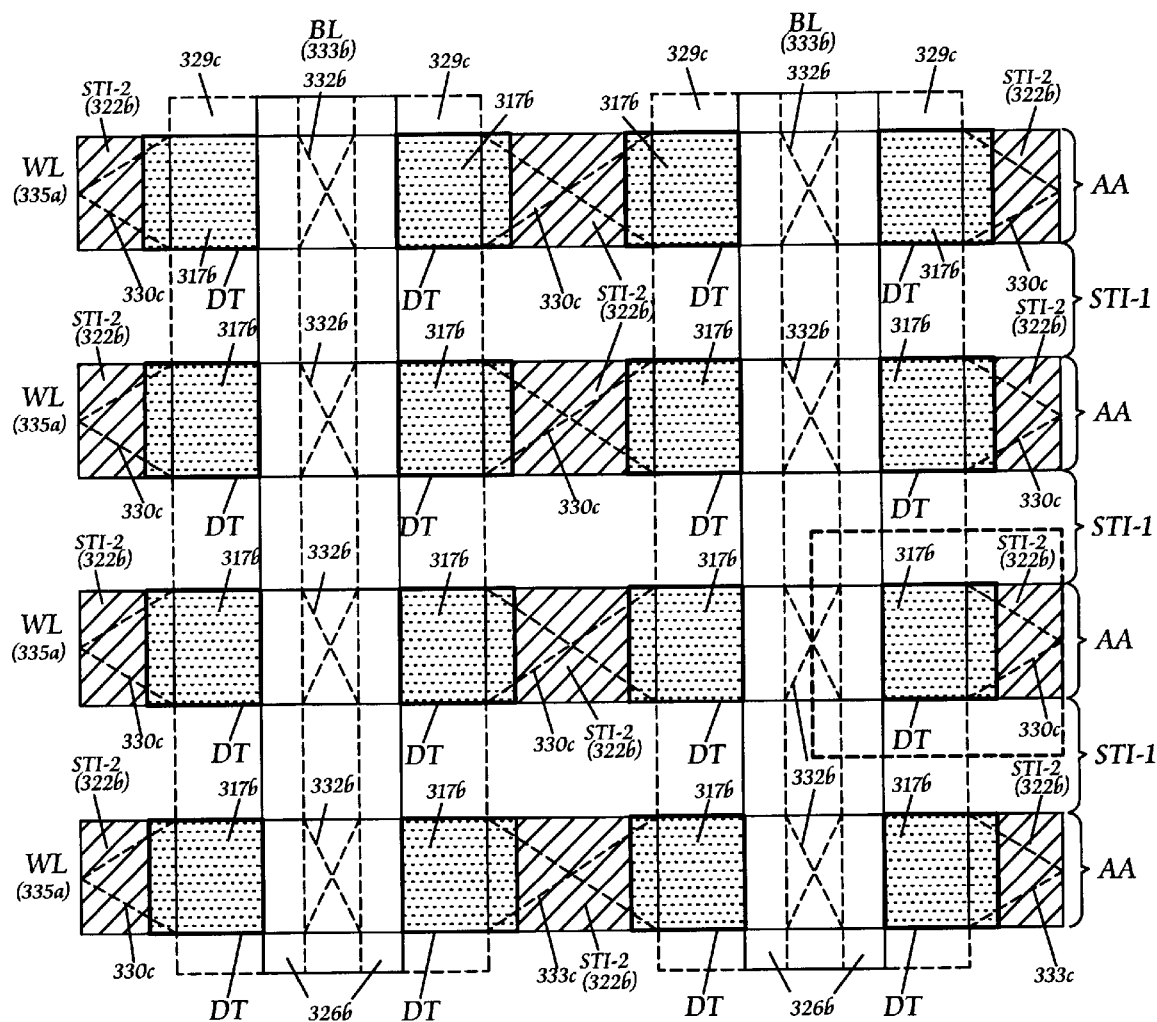
FIG. 5G shows a top plan view of a second-type contactless vertical transistor DRAM array of the present invention.

FIG. 5G shows a top plan view of a second-type contactless vertical transistor DRAM array of the present invention, in which the plurality of metal word-lines (WL) 335a integrated with the planarized common-gate conductive islands 330c are formed to be aligned above the plurality of active regions (AA); each of the plurality of conductive bit-lines (BL) 333b over the heavily-doped polycrystalline-silicon layer 332b being formed between the pair of third sidewall dielectric spacers 326b is formed over the flat bed being alternately formed by the common-drain diffusion region 323 and the first-type fifth raised field-oxide layer 304f; the plurality of first-type STI regions (STI-1) and the plurality of active regions (AA) are formed alternately on the semiconductor substrate 300; each of the plurality of deep trenches (DT) is filled with the conductive-gate node 317b; the second-type STI region (STI-2) is formed between the pair of deep-trenches (DT); and the pair of second sidewall dielectric spacers 329c are formed over each sidewall of nearby common-drain regions to define the planarized common-gate conductive islands 330c being connected with a portion of nearby conductive-gate nodes 317b. Similarly, a cell size of the second-type vertical transistor DRAM structure as marked by a dash square can be made to be equal to $4F^2$ if the deep-trench size is $1F^2$.

Accordingly, the advantages and the features of a vertical transistor DRAM structure and its contactless vertical transistor DARM arrays of the present invention are summarized as below:

(a) The vertical transistor DRAM structure of the present invention may offer a DRAM cell size of $4F^2$.

(b) The vertical transistor DRAM structure of the present invention can be fabricated with less masking photoresist steps to reduce the cost of manufacturing.

(c) The vertical transistor DRAM structure of the present invention can be fabricated by using a shallower depth of the deep trenches by decreasing the gate length of the vertical transistor and the separation length of the collar-oxide layer through self-aligned ion-implantations.

(d) The vertical transistor DRAM structure of the present invention offers the second-type STI regions with a depth approximately equal to a bottom surface level of the collar-oxide layer for nearby vertical transistor DRAM cells to reduce the possible coupling effects between the nearby vertical transistor DRAM cells.

(e) The first-type contactless vertical transistor DRAM array of the present invention offers the plurality of metal bit-lines integrated with the planarized common-drain conductive islands and the plurality of conductive word-lines for obtaining high-speed read and write operations.

(f) The second-type contactless vertical transistor DRAM array of the present invention offers the plurality of metal word-lines integrated with the planarized common-gate conductive islands and the plurality of conductive bit-lines for obtaining high-speed read and write operations.

While the present invention has been particularly shown and described with references to the present examples and embodiments as considered as illustrative and not restrictive. Moreover, the present invention is not to be limited to the details given herein,-it will be understood by those skilled in the art that various changes in forms and details may be made without departure from the true spirit and scope of the present invention.

What is claimed is:

1. A vertical transistor DRAM structure, comprising:

a semiconductor substrate of a first conductivity type having an active region and two first-type shallow-trench-isolation (STI) regions, wherein said active region is located between said two first-type STI regions;

a DRAM cell comprising a trench region and a common-drain region being formed on said semiconductor substrate, wherein said trench region comprises a deep-trench region and a second-type STI region outside of said deep-trench region being located in said active region and two first-type raised field-oxide layers being formed in said two first-type STI regions;

a second-type raised field-oxide layer being formed in said second-type STI region;

said deep-trench region comprising: a trench capacitor being formed in a lower portion of a deep trench, a collar-oxide layer together with a capacitor-node connector being formed in a central portion of said deep trench, and a vertical transistor region being formed in an upper portion of said deep trench;

said trench capacitor comprising an upper capacitor node being formed over a capacitor-dielectric layer and said capacitor-dielectric layer being formed over a lower capacitor node in said semiconductor substrate;

said vertical transistor region comprising a gate-dielectric layer over a portion of a sidewall of said deep trench together with a conductive-gate node being formed over an isolation silicon-dioxide node, said isolation silicon-dioxide node being formed over a source conductive node, and said source conductive node being formed over said capacitor-node connector and said collar-oxide layer; and said common-drain region being located in a side portion of said trench region comprising: a common-drain diffusion region of a second conductivity type being formed in an upper surface portion of said semiconductor substrate of said active region, a third sidewall dielectric spacer being formed over an outer sidewall of said trench region, and a flat bed located outside of said third sidewall dielectric spacer being formed by said common-drain diffusion region in said active region and two first-type fifth raised field-oxide layers in said two first-type STI regions, wherein said active region under said common-drain diffusion region comprises a deep implant region of said first conductivity type being formed in said semiconductor substrate near a central portion of said gate-dielectric layer, a common-source diffusion region of said second conductivity type being formed in said semiconductor substrate near an outside portion of said source conductive node, and a deeper implant region of said first conductivity type being formed in said semiconductor substrate near a central portion of said collar-oxide layer.

2. The vertical transistor DRAM structure according to claim 1, wherein a planarized common-drain conductive island is formed over said common-drain diffusion region outside of said third sidewall dielectric spacer and a metal bit-line integrated with said planarized common-drain conductive island are simultaneously patterned by a masking photoresist step being aligned above said active region for forming a first-type vertical transistor DRAM cell.

3. The vertical transistor DRAM structure according to claim 1, wherein a common-drain conductive bus line being acted as a bit line is formed over said flat bed outside of said third sidewall dielectric spacer and a second planarized thick-oxide layer is formed over said common-drain conductive bus line for forming a second-type vertical transistor DRAM cell.

4. The vertical transistor DRAM structure according to claim 1, wherein a capping conductive-gate layer acted as a word line being formed between a pair of first sidewall silicon-dioxide spacers is formed over said conductive-gate node in said deep trench and two first-type third raised field-oxide layers in said two first-type STI regions for forming a first-type vertical transistor DRAM cell.

5. The vertical transistor DRAM structure according to claim 1, wherein a planarized common-gate conductive island being formed outside of a second sidewall dielectric spacer is formed over a surface portion of said conductive-gate node in said deep trench and a metal word-line integrated with said planarized common-gate conductive island are simultaneously patterned by a masking photoresist step being aligned above said active region for forming a second-type vertical transistor DRAM cell.

6. The vertical transistor DRAM structure according to claim 1, wherein a bottom surface level of said second-type raised field-oxide layer is approximately equal to that of said collar-oxide layer and a heavily-implanted region of said second conductivity type being formed under said second-type raised field-oxide layer is connected with said lower capacitor node being formed by a heavily-doped diffusion region of said second conductivity type.

7. A contactless vertical transistor DRAM array, comprising:

a semiconductor substrate of a first conductivity type having a plurality of active regions and a plurality of first-type shallow-trench-isolation (STI) regions formed alternately;

a plurality of trench regions being alternately formed on said semiconductor substrate and transversely to the plurality of active regions, wherein each of the plurality of trench regions comprises a plurality of deep-trench regions and a plurality of second-type STI regions being formed between the plurality of deep-trench regions in the plurality of active regions and a plurality of first-type raised field-oxide layers being formed in the plurality of first-type STI regions;

a plurality of second-type raised field-oxide layers being formed in the plurality of second-type STI regions;

each of the plurality of deep-trench regions comprising: a trench capacitor being formed in a lower portion of a deep trench, a collar-oxide layer together with a capacitor-node connector being formed in a central portion of said deep trench, and a vertical transistor region being formed in an upper portion of said deep trench;

said trench capacitor comprising an upper capacitor node being formed over a capacitor-dielectric layer and said capacitor-dielectric layer being formed over a lower capacitor node in said semiconductor substrate;

said vertical transistor region comprising a gate-dielectric layer over a portion of a sidewall of said deep trench together with a conductive-gate node being formed over an isolation silicon-dioxide node, said isolation silicon-dioxide node being formed over a source conductive node, and said source conductive node being formed over said capacitor-node connector and said collar-oxide layer; and said common-drain region comprising: a common-drain diffusion region of a second conductivity type being formed in an upper portion of said semiconductor substrate in each of the plurality of active regions, a pair of third sidewall dielectric spacers being formed over each outer sidewall of nearby trench regions, and a flat bed located between said pair of third sidewall dielectric spacers being formed alternately by said common-drain diffusion region of said second conductivity type in said active region and a first-type fifth raised field-oxide layer in said first-type STI region, wherein said active region under said common-drain diffusion region comprises a deep implant region of said first conductivity type being formed in said semiconductor substrate near a central portion of said gate-dielectric layer, a common-source diffusion region of said second conductivity type being formed in said semiconductor substrate near an outer portion of said source conductive node, and a deeper implant region of said first conductivity type being formed in said semiconductor substrate near a central portion of said collar-oxide layer.

8. The contactless vertical transistor DRAM array according to claim 7, wherein a plurality of planarized common-drain conductive islands are formed over said common-drain diffusion regions between said pair of third sidewall dielectric spacers and a plurality of metal bit-lines integrated with said planarized common-drain conductive islands are simultaneously patterned by a masking photoresist step being aligned above the plurality of active regions for forming a first-type contactless vertical transistor DRAM array.

9. The contactless vertical transistor DRAM array according to claim 7, wherein a common-drain conductive bus line being acted as a bit-line is formed over said flat bed between said pair of third sidewall dielectric spacers and a second planarized thick-oxide layer is formed over each of said common-drain conductive bus lines for forming a second-type contactless vertical transistor DRAM array.

10. The contactless vertical transistor DRAM array according to claim 7, wherein a capping conductive-gate layer being formed between a pair of first sidewall silicon-dioxide spacers to act as a word line is formed over a flat surface alternately formed by said conductive-gate node in said deep trench and a first-type third raised field-oxide layer in said first-type STI region for forming a first-type contactless vertical transistor DRAM array.

11. The contactless vertical transistor DRAM array according to claim 7, wherein planarized common-gate conductive islands are formed between a pair of second sidewall dielectric spacers and on a portion of said conductive-gate nodes in the plurality of deep-trench regions and a plurality of metal word-lines integrated with said planarized common-gate conductive islands are simultaneously patterned by a masking photoresist step being aligned above the plurality of active regions for forming a second-type contactless vertical transistor DRAM array.

12. The contactless vertical transistor DRAM array according to claim 7, wherein a bottom surface level of said second-type raised field-oxide layer is approximately equal to that of said collar-oxide layer and a heavily-implanted region of said second conductivity type being formed under said second-type raised field-oxide layer is connected with said lower capacitor nodes being formed by heavily-doped diffusion regions of said second conductivity type.

13. A method of forming a contactless vertical transistor DRAM array, comprising the steps of:

providing a semiconductor substrate of a first conductivity type;

forming a shallow-trench-isolation (STI) structure having a plurality of active regions and a plurality of first-type STI regions formed alternately on said semiconductor substrate, wherein each of the plurality of active regions comprises a first conductive layer over a first dielectric layer and each of the plurality of first-type STI regions comprises a first-type first raised field-oxide layer forming a second masking dielectric layer over said STI structure and patterning said second masking dielectric layer to form a plurality of trench regions alternately and transversely to the plurality of active regions, wherein each of the plurality of trench regions is located between a common-drain region and a trench isolation region;

removing selectively said second masking dielectric layer to form the plurality of trench regions;

removing selectively said first conductive layers and said first dielectric layers in sequence and simultaneously etching said first-type first raised field-oxide-layers to form first-type second raised field-oxide layers;

etching anisotropically said semiconductor substrate to form a plurality of deep trenches in each of the plurality of trench regions;

forming sequentially a trench capacitor in a lower portion of said deep trench, a collar-oxide layer together with a capacitor-node connector in a central portion, of said deep trench, and a vertical transistor region in an upper portion of said deep trench said trench capacitor comprises an upper capacitor node being formed over a capacitor-dielectric layer and said capacitor-dielectric layer being formed over a lower capacitor node and said vertical transistor region comprises a source conductive node being formed over said collar-oxide layer and said capacitor-node connector, an isolation silicon-dioxide node being formed over a source conductive node, and a gate-dielectric layer over a portion of a sidewall of said deep trench together with a conductive-gate node being formed over said isolation silicon-dioxide node;

forming a protective silicon-dioxide layer over a formed structure surface and implanting a high dose of doing impurities of a second conductivity type across said protective silicon-dioxide layer into said conductive-gate nodes in a self-aligned manner; and forming a plurality of metal/conductive bit-lines and a plurality of conductive/metal word-lines to form said contactless vertical transistor DRAM array.

14. The method of claim 13, wherein the plurality of metal bit-lines and the plurality of conductive word-lines are fabricated by the steps comprising:

etching back to a depth equal to a thickness of said protective silicon-dioxide layer to form a pair of first sidewall silicon-dioxide spacers in each of the plurality of trench regions;

forming a planarized conductive layer over a gap between said pair of first sidewall silicon-dioxide spacers in each of the plurality of trench regions and etching back said planarized conductive layer to form a capping conductive-gate layer over a flat surface being alternately formed by said conductive-gate node in said deep-trench region and a first-type third raised field-oxide layer in said first-type STI region;

forming a first planarized thick-oxide layer over a gap in each of the plurality of trench regions;

forming a plurality of masking photoresist (PR3) over said common-drain regions and a portion of the plurality of trench regions;

removing sequentially said second masking dielectric layer, said first conductive layers, and said first dielectric layers in each of said trench isolation regions and etching anisotropically said semiconductor substrate to form second-type shallow trenches in each of said trench isolation regions;

forming a second-type planarized field-oxide layer over a gap in each of said trench isolation regions;

removing selectively said second masking dielectric layer in each of said common-drain regions and etching back anisotropically said first-type first raised field-oxide layers in each of said common-drain regions, said first planarized thick-oxide layer and said pair of first sidewall silicon-dioxide spacers in each of the plurality of trench regions, and said second-type planarized field-oxide layer in each of said trench isolation regions to a depth equal to a thickness of said first conductive layer to form first-type fourth raised field-oxide layers, etched-back first planarized thick-oxide layers and etched-back first sidewall silicon-dioxide spacers, and second-type first raised field-oxide layers, respectively;

removing selectively said first conductive layers in each of said common-drain regions;

implanting different types of doping impurities across said first dielectric layers into said semiconductor substrate in each of the plurality of active regions in a self-aligned manner to form a common-drain diffusion region of said second conductivity type in an upper surface portion of said semiconductor substrate, a deep implant region of said first conductive type being formed in said semiconductor substrate near a central portion of said gate-dielectric layer, and a deeper implant region of said first conductivity type being formed in said semiconductor substrate near a central portion of said collar-oxide layer in each of the plurality of active regions;

forming a pair of third sidewall dielectric spacers over sidewalls of nearby etched-back first sidewall silicon-dioxide spacers in each of said common-drain regions and removing said first dielectric layers and etching said first-type fourth raised field-oxide layers between said pair of third sidewall dielectric spacers to form a flat bed being formed alternately by said common-drain diffusion region and a first-type fifth raised field-oxide layer in each of said common-drain regions;

forming a planarized conductive layer over said flat bed between said pair of third sidewall dielectric spacers in each of said common-drain regions; and forming a metal layer over a formed structure surface and patterning said metal layer and said planarized conductive layers to form the plurality of metal bit-lines integrated with planarized common-drain conductive islands by using a masking photoresist step for forming a first-type contactless vertical transistor DRAM array.

15. The method of claim 14, wherein said masking photoresist step comprises a plurality of masking photoresist being aligned above the plurality of active regions or a plurality of hard masking dielectric layers being aligned above the plurality of active regions and a sidewall dielectric spacer being formed over each sidewall of the plurality of hard masking dielectric layers.

16. The method of claim 14, wherein said capping conductive-gate layer comprises a tungsten-disilicide or tungsten layer and said metal layer comprises an aluminum or copper layer being formed over a barrier-metal layer such as a titanium-nitride (TiN) or tantalum-nitride (TaN) layer.

17. The method of claim 14, wherein a bottom surface level of said second-type second raised field-oxide layer is approximately equal to that of said collar-oxide layer and a heavily-implanted region of said second conductivity type is formed in a surface portion of said semiconductor substrate under said second-type second raised field-oxide layer to connect with said lower capacitor nodes being formed by heavily-doped diffusion regions of said second conductivity type.

18. The method of claim 13, wherein the plurality of conductive bit-lines and the plurality of metal word-lines are fabricated by the steps comprising:

depositing a thick silicon-dioxide film to fill up a gap between said protective silicon-dioxide layer and planarizing said thick silicon-dioxide film and said protective silicon-dioxide layer to form a first planarized thick-oxide layer lined with an etched protective silicon-dioxide layer in each of the plurality of trench regions;

forming a plurality of masking photoresist (PR3) over said common-drain regions and a portion of the plurality of trench regions;

removing sequentially said second masking dielectric layer, said first conductive layers, and said first dielectric layers in each of said trench. isolation regions and etching anisotropically said semiconductor substrate to form second-type shallow trenches in each of said trench isolation regions;

forming a second-type planarized field-oxide layer over a gap in each of said trench isolation regions and etching back selectively said first planarized thick-oxide layers and said etched protective silicon-dioxide layer in each of the plurality of trench regions and said second-type planarized field-oxide layer and said first-type second raised field-oxide layers in each of said trench isolation regions to a top surface of said conductive-gate nodes;

forming a pair of second sidewall dielectric spacers over each outer sidewall of nearby second masking dielectric layers of said common-drain regions;

forming a planarized conductive layer between said pair of second sidewall dielectric spacers and on a portion of said conductive-gate nodes and etching back selectively said planarized conductive layers to a depth larger than a thickness of said first conductive layer to form planarized common-gate conductive layers;

forming a planarized capping-oxide layer over said planarized common-gate conductive layer between said pair of second sidewall dielectric spacers;

removing selectively said second masking dielectric layer in each of said common-drain regions and etching back selectively said first-type first raised field-oxide layers in each of said common-drain regions and said planarized capping-oxide layer and said pair of second sidewall dielectric spacers between said common-drain regions to a depth equal to a thickness of said first conductive layer to form first-type fourth raised field-oxide layers, etched-back planarized capping-oxide layers, and etched-back second sidewall dielectric spacers, respectively;

implanting different types of doping impurities across said first dielectric layers into said semiconductor substrate in each of said common-drain regions in a self-aligned manner to form different implant regions in each of the plurality of active regions, wherein said different implant regions may comprise a common-drain diffusion region of said second conductivity type being formed in an upper surface portion of said semiconductor substrate, a deep implant region of said first conductivity type being formed near a central portion of said gate-dielectric layer, and a deeper implant region of said first conductivity type being formed near a central portion of said collar-oxide layer;

forming a pair of third sidewall dielectric spacers over each outer sidewall of nearby trench regions and removing said first dielectric layers and etching said first-type fourth raised field-oxide layers between said pair of third sidewall dielectric spacers to form a flat bed being alternately formed by said common-drain diffusion region and a first-type fifth raised field-oxide layer;

forming a highly conductive common-drain bus-line over said flat bed between said pair of third sidewall dielectric spacers in each of said common-drain regions, wherein said highly conductive common-drain bus-line comprises a heavily-doped polycrystalline-silicon layer silicided with a refractory metal-silicide layer or a heavily-doped polycrystalline-silicon layer capped with a tungsten-silicide or tungsten layer;

forming a second planarized thick-oxide layer over said highly conductive common-drain bus-line between said pair of third sidewall dielectric spacers in each of said common-drain regions, wherein said highly conductive common-drain bus-line is acted as a common-drain conductive bit-line;

removing said etched-back planarized capping-oxide layer over said planarized common-gate conductive layer by using an etching-back method or chemical-mechanical polishing; and forming a metal layer over a formed structure surface and patterning simultaneously said metal layer and said planarized common-gate conductive layers by using a masking photoresist step to form the plurality of metal word-lines integrated with planarized common-gate conductive islands for forming a second-type contactless vertical transistor DRAM array.

19. The method of claim 18, wherein said masking photoresist step comprises a plurality of masking photoresist being aligned above the plurality of active regions or a plurality of hard masking dielectric layers being aligned above the plurality of active regions and a sidewall dielectric spacer being formed over each sidewall of the plurality of hard masking dielectric layers.

20. The method of claim 18, wherein said planarized common-gate conductive island comprises a tungsten-disilicide or tungsten island and said metal layer comprises an aluminum or copper layer being formed over a barrier-metal layer such as a titanium-nitride (TiN) or tantalum-nitride (TaN) layer.

* * * * *